(12) United States Patent
Kim et al.

(10) Patent No.: US 9,817,283 B2
(45) Date of Patent: Nov. 14, 2017

(54) LIQUID CRYSTAL DISPLAY

(71) Applicant: Samsung Display Co., Ltd., Yongin-si (KR)

(72) Inventors: Duk-Sung Kim, Asan-si (KR); Bong-Jun Lee, Seoul (KR); Sung Man Kim, Seoul (KR); Seul Ki Kim, Anyang-si (KR); Jin Yun Kim, Asan-si (KR); Dong Wuuk Seo, Asan-si (KR); Min Hee Son, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/180,259

(22) Filed: Jun. 13, 2016

(65) Prior Publication Data

US 2016/0282685 A1   Sep. 29, 2016

Related U.S. Application Data

(63) Continuation of application No. 14/139,188, filed on Dec. 23, 2013, now Pat. No. 9,366,890.

(30) Foreign Application Priority Data

Feb. 12, 2013   (KR) .......................... 10-2013-0014968

(51) Int. Cl.
*G02F 1/1343*   (2006.01)
*G02F 1/133*    (2006.01)
(Continued)

(52) U.S. Cl.
CPC ...... *G02F 1/134309* (2013.01); *G02F 1/1343* (2013.01); *G02F 1/1368* (2013.01);
(Continued)

(58) Field of Classification Search
CPC ................................................. G02F 1/134363
See application file for complete search history.

(56) References Cited

U.S. PATENT DOCUMENTS 6,762,815 B2   7/2004  Lee
7,180,565 B2   2/2007  Hong et al.
(Continued)

FOREIGN PATENT DOCUMENTS

EP   2 472 310       7/2012
JP   2002-323706    11/2002
(Continued)

OTHER PUBLICATIONS

Final Office Action dated Nov. 24, 2016, in U.S. Appl. No. 14/139,230.

(Continued)

*Primary Examiner* — Wen-Ying P Chen
(74) *Attorney, Agent, or Firm* — H.C. Park & Associates, PLC

(57) ABSTRACT

A display, includes: a substrate; first signal lines (FSLs) disposed on the substrate and extending in substantially a first direction; a gate insulating layer (GIL) disposed on the FSLs; a first electrode disposed on the GIL; a thin film transistor (TFT) connected to a FSL of the FSLs and including the GIL and the first electrode; a pixel electrode (PE) extending in substantially the first direction, connected to the TFT, and configured to receive a data voltage from the TFT; a common electrode (CE) overlapping with at least a portion of the PE; and a first insulating layer disposed between the PE and CE. One of the PE and the CE has a planar shape and the other includes branch electrodes overlapping with the planar shape and extending substantially parallel to the FSL. At least a portion of the CE overlaps with at least a portion of the FSL.

6 Claims, 31 Drawing Sheets

(51) Int. Cl.
  *G02F 1/1333* (2006.01)
  *G02F 1/1368* (2006.01)
  *H01L 27/12* (2006.01)
  *H01L 29/786* (2006.01)
  *G02F 1/1362* (2006.01)

(52) U.S. Cl.
  CPC ...... *G02F 1/13306* (2013.01); *G02F 1/13439* (2013.01); *G02F 1/133345* (2013.01); *G02F 1/134363* (2013.01); *G02F 1/136286* (2013.01); *H01L 27/124* (2013.01); *H01L 27/1225* (2013.01); *H01L 29/7869* (2013.01); *G02F 2001/134318* (2013.01); *G02F 2001/134372* (2013.01); *G02F 2001/136272* (2013.01); *G02F 2201/121* (2013.01)

(56) References Cited

U.S. PATENT DOCUMENTS

| | | | |
|---|---|---|---|
| 7,196,759 | B2 | 3/2007 | Ahn et al. |
| 7,280,176 | B2 | 10/2007 | Yuh et al. |
| 7,978,294 | B2 | 7/2011 | Lee et al. |
| 8,294,857 | B2 | 10/2012 | Lee et al. |
| 8,357,554 | B2 | 1/2013 | Lee et al. |
| 8,552,432 | B2 | 10/2013 | Lee et al. |
| 2005/0093029 | A1 | 5/2005 | Kim et al. |
| 2007/0035675 | A1 | 2/2007 | Um et al. |
| 2007/0052899 | A1 | 3/2007 | Lin et al. |
| 2007/0165149 | A1* | 7/2007 | Kim ............... G02F 1/134336 349/39 |
| 2009/0059110 | A1 | 3/2009 | Sasaki et al. |
| 2009/0073365 | A1 | 3/2009 | Jeon |
| 2009/0101908 | A1 | 4/2009 | Kwack |
| 2010/0007837 | A1 | 1/2010 | Ham et al. |
| 2010/0156771 | A1 | 6/2010 | Lee et al. |
| 2010/0238369 | A1 | 9/2010 | Kim |
| 2010/0265238 | A1 | 10/2010 | Lee et al. |
| 2010/0289733 | A1 | 11/2010 | Kim et al. |
| 2012/0026206 | A1 | 2/2012 | Moon et al. |
| 2012/0050643 | A1 | 3/2012 | Li et al. |
| 2012/0162208 | A1 | 6/2012 | Park et al. |
| 2013/0020591 | A1 | 1/2013 | Park et al. |
| 2014/0313113 | A1* | 10/2014 | Jang ............... G09G 3/3614 345/87 |

FOREIGN PATENT DOCUMENTS

| | | |
|---|---|---|
| JP | 2003-207796 | 7/2003 |
| JP | 2009-063643 | 3/2009 |
| JP | 2009-122569 | 6/2009 |
| JP | 2012-079694 | 4/2012 |
| JP | 2010-122355 | 6/2016 |
| KR | 10-2007-0119260 | 12/2007 |
| KR | 10-2008-0000827 | 1/2008 |
| KR | 10-2009-0034137 | 4/2009 |
| KR | 10-2010-0068636 | 6/2010 |
| KR | 10-2011-0067227 | 6/2011 |
| KR | 10-2011-0071313 | 6/2011 |
| KR | 10-2012-0008381 | 1/2012 |
| KR | 10-2012-0037814 | 4/2012 |
| KR | 10-2012-0075111 | 7/2012 |
| KR | 10-1182471 | 9/2012 |
| KR | 10-2012-0110888 | 10/2012 |
| KR | 10-2012-0116715 | 10/2012 |

OTHER PUBLICATIONS

Non-Final Office Action dated Mar. 30, 2016, in U.S. Appl. No. 14/139,230.
Non-Final Office Action dated May 8, 2015, in U.S. Appl. No. 14/139,230.
European Extended Search Report dated Jun. 16, 2014, for EP Patent Application No. 14154271.2-1904.
Notice of Allowance dated Apr. 20, 2016, in U.S. Appl. No, 14/139,188.
Notice of Allowance dated Feb. 17, 2016, in U.S. Appl. No. 14/139,188.
Non-Final Office Action dated Oct. 7, 2015, in U.S. Appl. No. 14/139,188.
Non-Final Office Action dated Feb. 10, 2017, in U.S. Appl. No. 14/139,230.
Final Office Action dated Oct. 14, 2016, in U.S. Appl. No. 14/139,230.
Notice of Allowance dated Jun. 15, 2017, in U.S. Appl. No. 14/139,230.

* cited by examiner

LIQUID CRYSTAL DISPLAY

CROSS-REFERENCE TO RELATED APPLICATION

This application is a continuation of U.S. patent application Ser. No. 14/139,188, filed on Dec. 23, 2013, and claims priority from and the benefit of Korean Patent Application No. 10-2013-0014968, filed on Feb. 12, 2013, each of which is incorporated by reference for all purposes as if set forth herein.

BACKGROUND

Field

Exemplary embodiments relate to display technology, and more particularly to, a liquid crystal display including two field generating electrodes disposed on the same substrate.

Discussion

Conventional liquid crystal displays typically include two display panels on which field generating electrodes, such as pixel electrodes and a common electrode, are formed, and a liquid crystal layer disposed therebetween. To facilitate the display of images, voltage is usually applied to the field generating electrodes to form an electric field in the liquid crystal layer. In this manner, the alignment of liquid crystal molecules of the liquid crystal layer is affected by the electric field, and polarization of incident light is controlled in association therewith. The transmittance of the liquid crystal display may increase when, for instance, the alignment of the liquid crystal molecules is controlled better.

Typically, each pixel electrode of a conventional liquid crystal display is connected with a switching element that is, in turn, connected with signal lines, such as a gate line and a data line. The switching element usually includes a three (3)-terminal element, such as a thin film transistor, which transfers data voltage to the pixel electrode through an output terminal thereof. It is noted that the pixel electrodes and the common electrode may be disposed on one display panel, such as the display panel including the switching element(s).

Therefore, there is a need for an approach that provides efficient, cost effective techniques to improve the control of liquid crystal molecules, and, in turn, the transmittance and/or other characteristics of an associated display device.

The above information disclosed in this Background section is only for enhancement of understanding of the background of the invention, and, therefore, it may contain information that does not form the prior art that is already known in this country to a person of ordinary skill in the art.

SUMMARY

Exemplary embodiments provide a liquid crystal display including two field generating electrodes disposed on the same substrate.

Additional aspects will be set forth in the detailed description which follows and, in part, will be apparent from the disclosure, or may be learned by practice of the invention.

According to exemplary embodiments, a liquid crystal display, includes: a substrate; first signal lines disposed on the substrate, the first signal lines longitudinally extending in substantially a first direction; a gate insulating layer disposed on the first signal lines; a first electrode disposed on the gate insulating layer; a thin film transistor connected to a first signal line of the first signal lines, the thin film transistor including the gate insulating layer and the first electrode; a pixel electrode longitudinally extending in substantially the first direction, the pixel electrode being connected to the thin film transistor and configured to receive a data voltage from the thin film transistor; a common electrode overlapping with at least a portion of the pixel electrode; and a first insulating layer disposed between the pixel electrode and the common electrode. One of the pixel electrode and the common electrode has a planar shape and the other includes a plurality of branch electrodes overlapping with at least a portion of the planar-shaped electrode, the branch electrodes extend substantially parallel to the first signal line, and a portion of the common electrode overlaps with at least a portion of the first signal line.

According to exemplary embodiments, transmittance of a liquid crystal display including two field generating electrodes disposed on the same substrate may be increased. In addition, the parasitic capacitance may be reduced between a signal line and a field generating electrode, which, thereby, minimizes signal delay and crosstalk between the signal line and the field generating electrode. Furthermore, light leakage caused, at least in part, by electric field distortions may also be reduced.

According to exemplary embodiments, a number of data driving circuit chips may be reduced, which, thereby, reduces an edge portion (e.g., bezel region) of a corresponding display panel. Moreover, when integrating a gate driving circuit on a substrate, exemplary embodiments permit greater design freedom in the choice of integration regions for the gate driving circuit.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
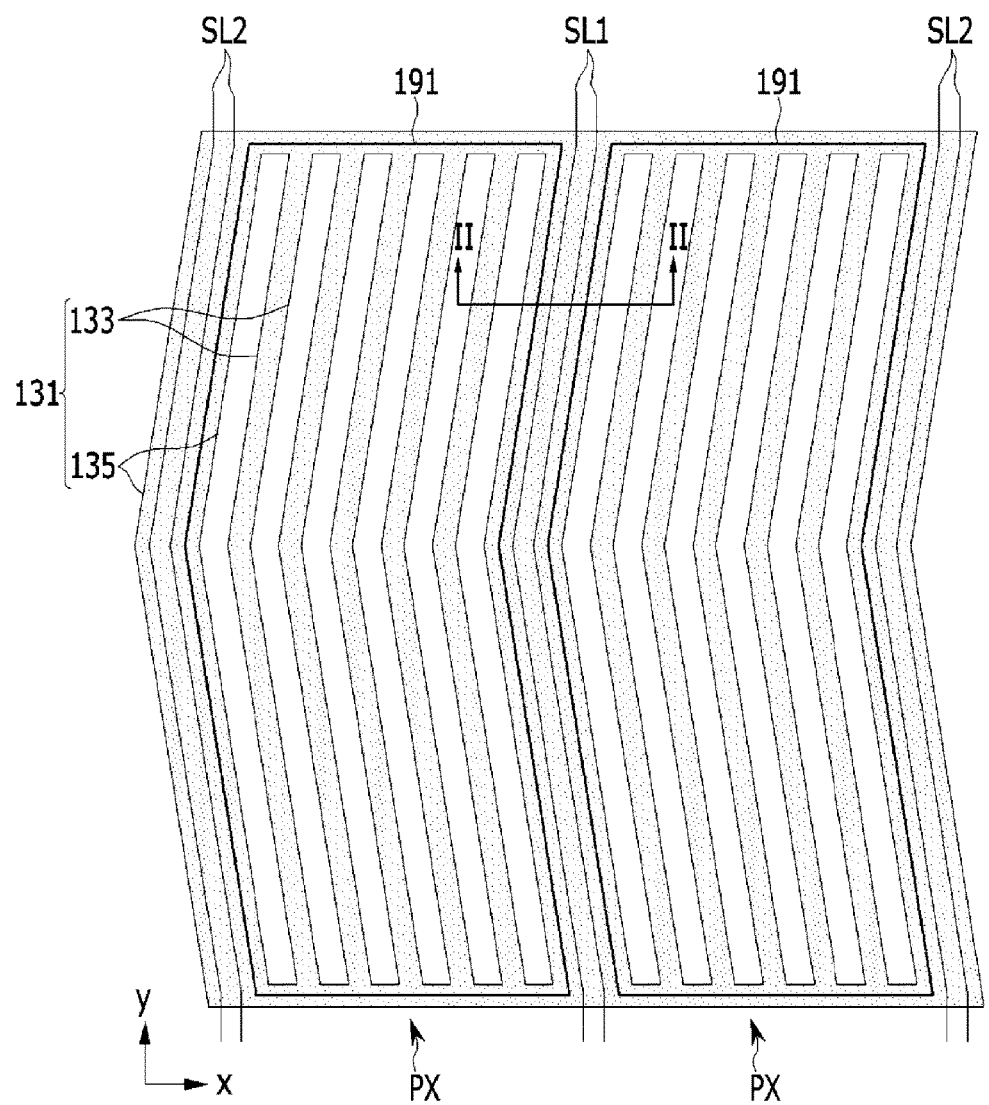
FIG. 1 is a layout view of a liquid crystal display, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper," and/or the like, may be used herein for descriptive purposes, and thereby, to describe one element or feature's relationship to another element(s) or feature(s) as illustrated in the drawings. Spatially relative terms are intended to encompass different orientations of an apparatus in use or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and as such, the spatially relative descriptors used herein interpreted accordingly.

The terminology used herein is for the purpose of describing particular embodiments and is not intended to be limiting. As used herein, the singular forms "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
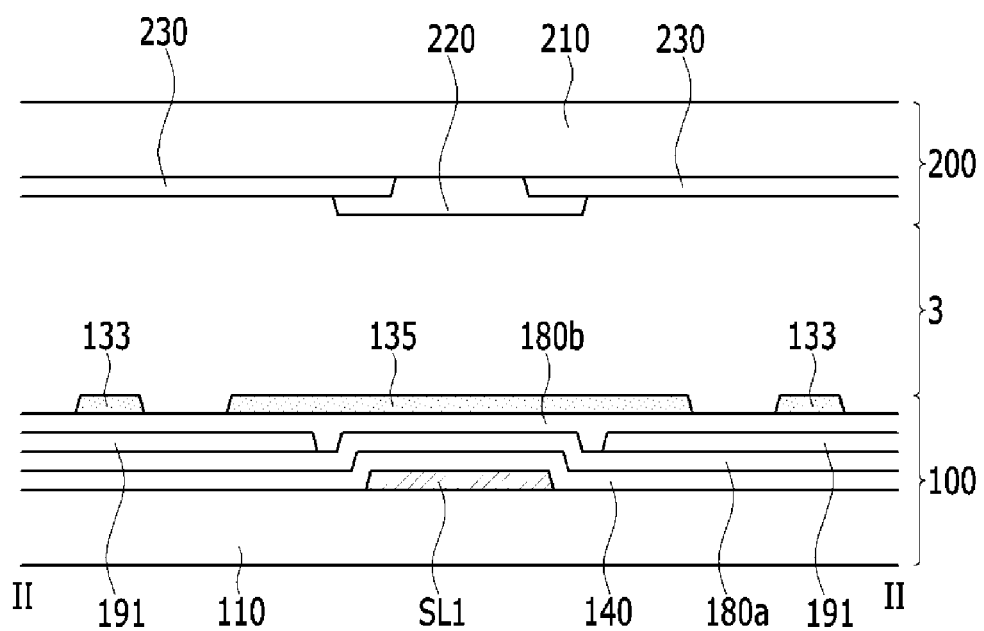
FIG. 2 is a cross-sectional view of the liquid crystal display of FIG. 1 taken along sectional line II-II, according to exemplary embodiments.

FIG. 1 is a layout view of a liquid crystal display, according to exemplary embodiments. FIG. 2 is a cross-sectional view of the liquid crystal display of FIG. 1 taken along sectional line II-II.

Referring to FIG. 1, a liquid crystal display includes a plurality of pixels PX arranged in, for example, a matrix formation. It is contemplated, however, that any suitable arrangement may be utilized. As shown, a row direction is referred to as a first (or x-direction), and a column direction is referred to as a second (or y-direction). Referring to FIG. 2, the liquid crystal display further includes a lower panel 100 and an upper panel 200 facing each other, and a liquid crystal layer 3 disposed therebetween.

According to exemplary embodiments, the lower panel 100 includes a plurality of signal lines disposed on an insulation substrate 110. The plurality of signal lines may include a first signal line SL1 and a second signal line SL2 alternately arranged in the x-direction. In this manner, the first signal line SL1 and the second signal line SL2 may substantially extend in the y-direction. To this end, the longitudinal extension of the first signal line SL1 and the second signal line SL2 in the y-direction may also be periodically curved (or otherwise bent) in the x-direction, such as seen in FIG. 1. Alternatively, the first signal line SL1 and the second signal line SL2 may extend in a straight (or substantially straight) line.

The first signal line SL1 and the second signal line SL2 may transmit signals of the same or different kind. For example, the first signal line SL1 and the second signal line SL2 of the same kind may be data lines configured to transmit a data signal to each pixel PX. As another example, the first signal line SL1 may be a gate line configured to transmit a gate signal of a combination of a gate-on voltage Von and a gate-off voltage Voff to each pixel PX. In this manner, the second signal line SL2 may be a common voltage line configured to transmit a common voltage Vcom, or the second signal line SL2 may be a gate line.

As shown in FIG. 1, a respective first signal line SL1 and second signal line SL2 may be disposed in association with each pixel array in the x-direction. It is contemplated, however, that the first signal line SL1 and the second signal line SL2 may be alternatively disposed, such as, in association with, two or more pixel arrays.

A gate insulating layer 140 is disposed on the first signal line SL1 and the second signal line SL2. The gate insulating layer 140 may be made of (or otherwise include) any suitable material, such as, for example, an inorganic insulator, e.g., silicon nitride (SiNx), silicon oxide (SiOx), etc.

A first passivation layer 180a may be disposed on the gate insulating layer 140. The first passivation layer 180a may be made of (or otherwise include) any suitable material, such as, for instance, an organic insulating material and/or an inorganic insulating material. It is noted, however, that the first passivation layer 180a may be omitted.

A plurality of pixel electrodes 191 may be disposed on the first passivation layer 180a. A pixel electrode 191 disposed at each pixel PX may exhibit a planar shape, such as a polygonal shape including edges parallel to the first signal line SL1 and/or the second signal line SL2. A length of the pixel electrode 191 in the y-direction may be longer than the length in the x-direction. That is, the length of one pixel PX in the y-direction may be longer than the length in the x-direction.

According to exemplary embodiments, each pixel electrode 191 may be disposed between a first signal line SL1 and a second signal line SL2; however, any other suitable arrangement may be utilized. The pixel electrode 191 may not overlap with the first signal line SL1 or the second signal line SL2. The pixel electrode 191 may be formed of any suitable material, such as, for example, a transparent conductive material, e.g., aluminum zinc oxide (AZO), gallium zinc oxide (GZO), indium tin oxide (ITO), indium zinc oxide (IZO), etc. It is also contemplated that one or more conductive polymers (ICP) may be utilized, such as, for example, polyaniline, poly(3,4-ethylenedioxythiophene) poly(styrenesulfonate) (PEDOT:PSS), etc.

The pixel electrode 191 may receive a data signal through a switching element (not shown), such as a thin film transistor. In this manner, the switching element may include terminals connected to the first signal line SL1 or the second signal line SL2. It is noted that the first signal line SL1 or the second signal line SL2 may be disposed at a layer closest to the insulation substrate 110 among the layers in which several terminals of the switching element are disposed. For instance, the first signal line SL1 and/or the second signal line SL2 may be directly disposed on the insulation substrate 110.

A second passivation layer 180b made of any suitable insulating material may be disposed on the pixel electrode 191.

According to exemplary embodiments, a common electrode 131 may be disposed on the second passivation layer 180b. The common electrode 131 overlaps with the pixel electrode 191 of each pixel PX. Further, the common electrode 131 may include a plurality of branch electrodes 133 substantially extending parallel to each other and separated from each other, as well as includes a boundary portion 135 overlapping with the first signal line SL1 and the second signal line SL2.

A plurality of branch electrodes 133 disposed in association with one pixel PX may be connected to each other in a lower end and an upper end thereof. A region between the branch electrodes 133 may be referred to as a slit.

In exemplary embodiments, the boundary portion 135 may be disposed close to a boundary of the pixel(s) PX neighboring the boundary portion 135 in the x-direction. As shown in FIGS. 1 and 2, the boundary portion 135 may cover the first signal line SL1 and the second signal line SL2. That is, the boundary portion 135 may cover both edge sides of the first signal line SL1 and/or the second signal line SL2. It is noted, however, that the first signal line SL1 and/or the second signal line SL2 may longitudinally extend from the boundary portion 135 in the y-direction. In exemplary embodiments, the branch electrode 133 and the boundary portion 135 may substantially extend parallel to the first signal line SL1 and the second signal line SL2.

According to exemplary embodiments, the common electrode 131 receives a common voltage, and the common electrode 131 may be disposed in association with a plurality of pixels PX that are connected to each other. When, for instance, the second signal line SL2 is a common voltage line, the common electrode 131 may be electrically connected to the second signal line SL2. The common electrode 131 may be made of (or otherwise include) any suitable material, such as one or more of the aforementioned transparent conductive materials.

The upper panel 200, according to exemplary embodiments, may include a light blocking member 220 and a color filter 230 respectively disposed on an insulation substrate 210. In this manner, the light blocking member 220 may include a portion covering (e.g., disposed over) the first signal line SL1 and the second signal line SL2, as well as include a portion overlapping with a corresponding portion of the color filter 230. The light blocking member 220 prevents light leakage between neighboring pixels PX, such that openings therein define the pixels PX. The color filter 230 may be configured to facilitate display of one or more primary colors, e.g., red, green, and/or blue. It is contemplated, however, that color filter 230 may facilitate the display of any other suitable color, such as cyan, magenta, yellow, white, etc., colors.

Unlike as shown in FIG. 2, at least one of the light blocking member 220 and the color filter 230 may be disposed on the lower panel 100.

The liquid crystal layer 3 includes liquid crystal molecules (not shown). The liquid crystal molecules may be aligned so that long axes thereof are horizontal (or otherwise parallel) to the surfaces of the lower and upper display panels 100 and 200 in a state when an electric field is not applied.

According to exemplary embodiments, when a data voltage is applied to the pixel electrode 191, an electric field is imposed on the liquid crystal layer 3 together with the common electrode 131, which may be supplied with a common voltage. In this manner, the alignment direction of the liquid crystal molecules of the liquid crystal layer 3 may be correspondingly controlled based on the fringe patterns of the electric field. As previously mentioned, the controlled alignment of the liquid crystal molecules may be utilized to facilitate the display of a corresponding image. Accordingly, the pixel electrode 191 and the common electrode 131 may be respectively referred to as field generating electrodes.

According to exemplary embodiments, the length of each pixel PX in the y-direction is longer than the length in the x-direction, and the branch electrodes 133 of the common electrode 131 may substantially extend in the y-direction. In this manner, as compared to when the branch electrodes 133 extend in the x-direction, a disclination region that may be generated at or near an end region of a slit between the branch electrodes 133 may be decreased, such that the transmittance of the liquid crystal display may be increased.

In exemplary embodiments, the first signal line SL1 or the second signal line SL2 overlapping with the boundary portion 135 of the common electrode 131 may be disposed on the layer closest to the insulation substrate 110 among the layers in which the several terminals of the switching element connected to the pixel electrode 191 are disposed. That is, according to exemplary embodiments, the first signal line SL1 or the second signal line SL2 may be disposed under the gate insulating layer 140, and, for instance, may be disposed directly on the insulation substrate 110. As such, a distance between the first signal line SL1 or the second signal line SL2 and the boundary portion 135 of the common electrode 131 or the pixel electrode 191 may be maximized. Accordingly, the parasitic capacitance between the first signal line SL1 or the second signal line SL2 and the boundary portion 135 of the common electrode 131 or the pixel electrode 191 may be reduced, such that a signal delay of the first signal line SL1 or the second signal line SL2 may be minimized. It is also noted that crosstalk between the first signal line SL1 or the second signal line SL2 and the boundary portion 135 of the common electrode 131 or the pixel electrode 191 may be reduced, such that light leakage due to electric field distortion may be reduced.

According to exemplary embodiments, since the parasitic capacitance between the first signal line SL1 or the second signal line SL2 and the boundary portion 135 of the common electrode 131 or the pixel electrode 191 may be reduced, it is not necessary to form an insulating layer formed of an organic insulating material between the first signal line SL1 or the second signal line SL2 and the common electrode 131 or the pixel electrode 191. In other words, the first passivation layer 180*a* may not include an organic insulating material. When, for example, the insulating layer of the first passivation layer 180*a* is formed of an inorganic insulating material, a material cost may be reduced, as compared with instances when an organic insulating material is utilized and a processing step, such as deposition and photo-processing is utilized, processing time to manufacture the corresponding liquid crystal display may be reduced. Furthermore, undesirable absorption of incident light by an organic insulating material may be reduced, such that the transmittance of the liquid crystal display may be further increased. To this end, it is also not necessary to form a contact hole in a comparatively thick organic insulating material, such that an aperture ratio is not undesirably reduced.

Figure 3:
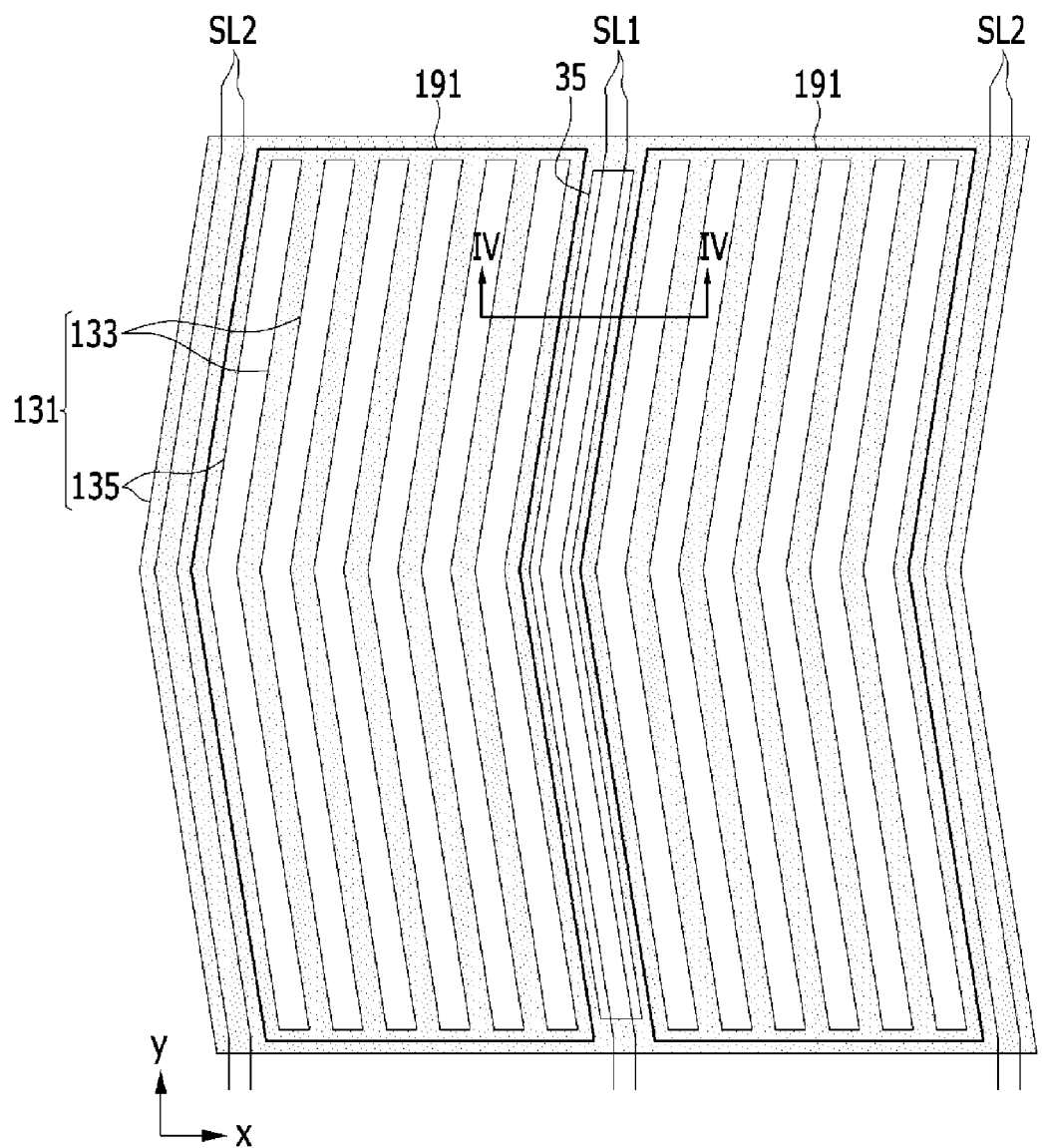
FIG. 3 is a layout view of a liquid crystal display, according to exemplary embodiments.
Figure 4:
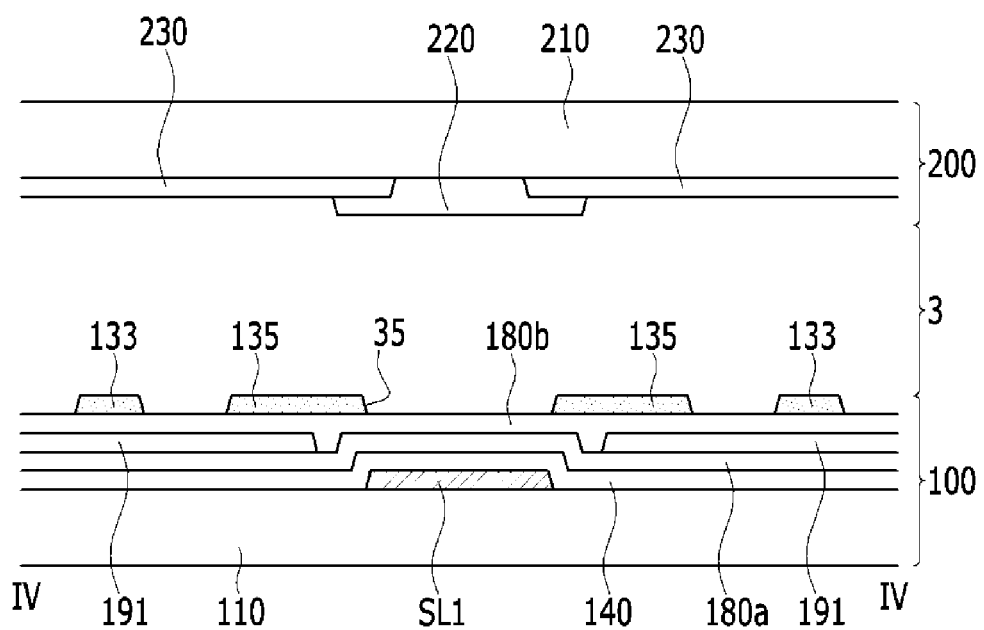
FIG. 4 is a cross-sectional view of the liquid crystal display of FIG. 3 taken along sectional line IV-IV, according to exemplary embodiments.

FIG. 3 is a layout view of a liquid crystal display, according to exemplary embodiments. FIG. 4 is a cross-sectional view of the liquid crystal display of FIG. 3 taken along sectional line IV-IV.

Referring to FIGS. 3 and 4, the liquid crystal display is substantially similar to the liquid crystal display illustrated in FIGS. 1 and 2; however, the liquid crystal display of FIGS. 3 and 4 includes an alternatively configured boundary portion 135 of the common electrode 131. Accordingly, to avoid obscuring exemplary embodiments described herein, duplicative descriptions of similarly configured features are omitted.

As shown in FIGS. 3 and 4, the boundary portion 135 of the common electrode 131 may include an opening 35 elongated substantially in the y-direction. In FIG. 3, while only the portion of the boundary portion 135 disposed on the first signal line SL1 includes the opening 35, it is contemplated that the portion of the boundary portion 135 disposed on the second signal line SL2 may also include an opening 35. According to exemplary embodiments, the longitudinal extension of the opening 35 may be curved (or otherwise bent) in the x-direction. Alternatively, the opening 35 may be straight or substantially straight.

A width of the opening 35 in the x-direction may be larger, smaller, or equal to the width of the first signal line SL1 or the second signal line SL2 in the x-direction. In this manner, the opening 35 may expose the edge side(s) of the first signal line SL1 or the second signal line SL2, or may cover at least one edge side thereof.

Figure 5:
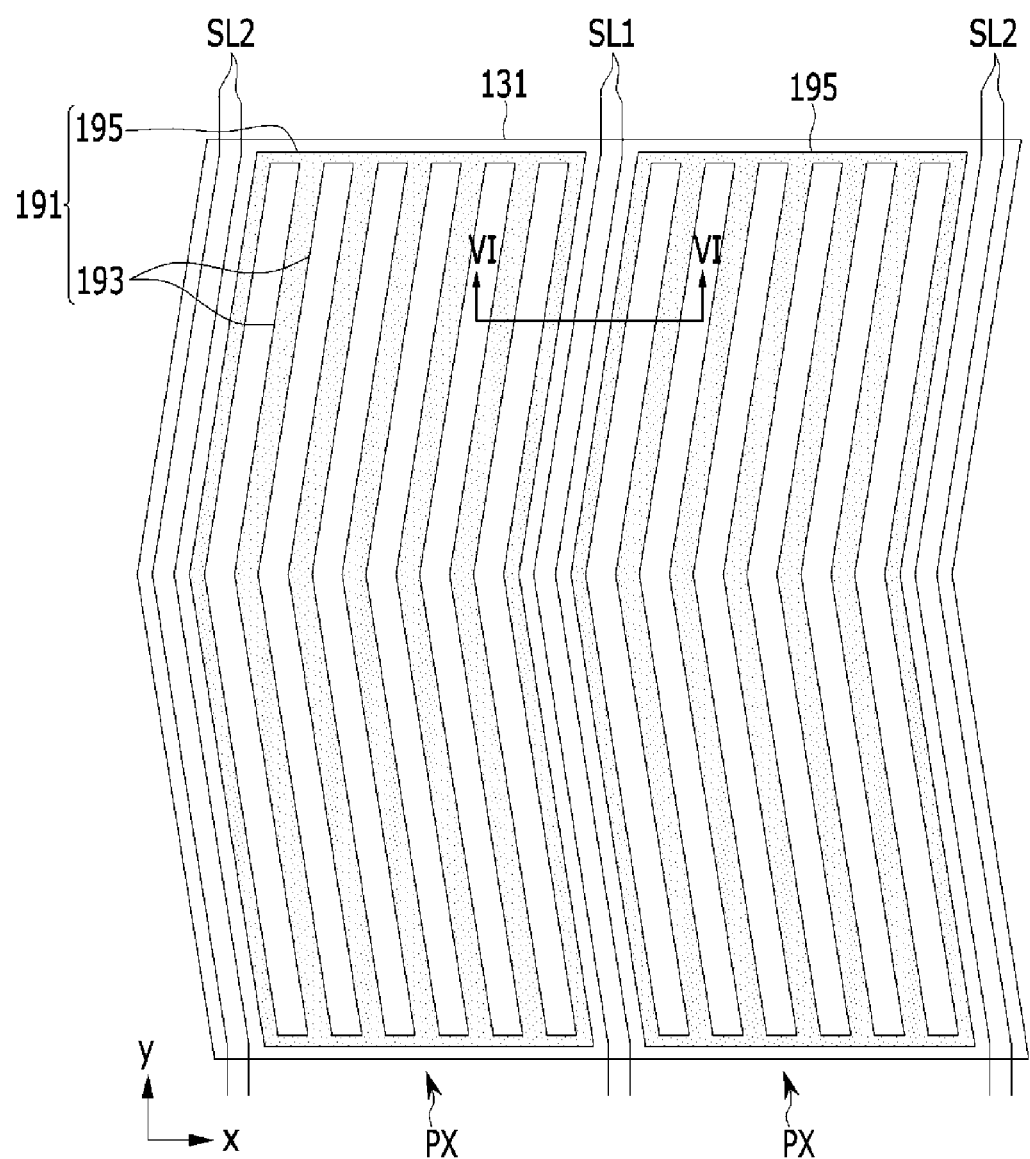
FIG. 5 is a layout view of a liquid crystal display, according to exemplary embodiments.
Figure 6:
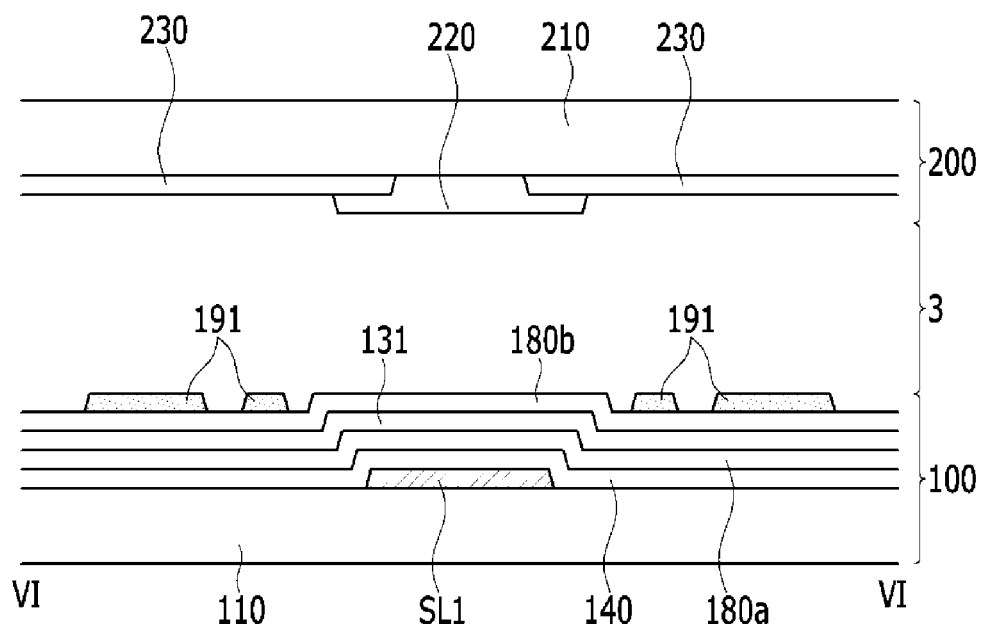
FIG. 6 is a cross-sectional view of the liquid crystal display of FIG. 5 taken along sectional line VI-VI, according to exemplary embodiments.

FIG. 5 is a layout view of a liquid crystal display, according to exemplary embodiments. FIG. 6 is a cross-sectional view of the liquid crystal display of FIG. 5 taken along sectional line VI-VI.

Referring to FIGS. 5 and 6, the liquid crystal display is substantially similar to the liquid crystal display illustrated in FIGS. 1 and 2; however, the liquid crystal display of FIGS. 5 and 6 may include alternative depositions and configurations of the common electrode 131 and the pixel electrode 191. Accordingly, to avoid obscuring exemplary embodiments described herein, duplicative descriptions of similarly configured features are omitted.

As seen in FIGS. 5 and 6, the common electrode 131 may be disposed on the first passivation layer 180a. The second passivation layer 180b and a plurality of pixel electrodes 191 may be sequentially disposed on the common electrode 131. The common electrode 131 may be formed on the entire surface (or a portion thereof) of the insulation substrate 110 and may include at least one opening. In this manner, the common electrode 131 may be disposed in association with each pixel PX, and, thereby, may exhibit a planar shape. Further, the common electrode 131 may overlap with the first signal line SL1 and the second signal line SL2. As shown in FIGS. 5 and 6, the common electrode 131 may cover the first signal line SL1 and the second signal line SL2.

According to exemplary embodiments, each pixel electrode 191 may overlap with a corresponding portion of the common electrode 131 disposed in association with the pixel PX including the pixel electrode 191. Further, the pixel electrode 191 may include a plurality of branch electrodes 193 substantially parallel to each other and separated from each other. A plurality of branch electrodes 133 of one pixel electrode 191 may be connected to each other at or near a lower end portion and/or an upper end portion thereof. The region between the branch electrodes 193 may be referred to as a slit.

Figure 7:
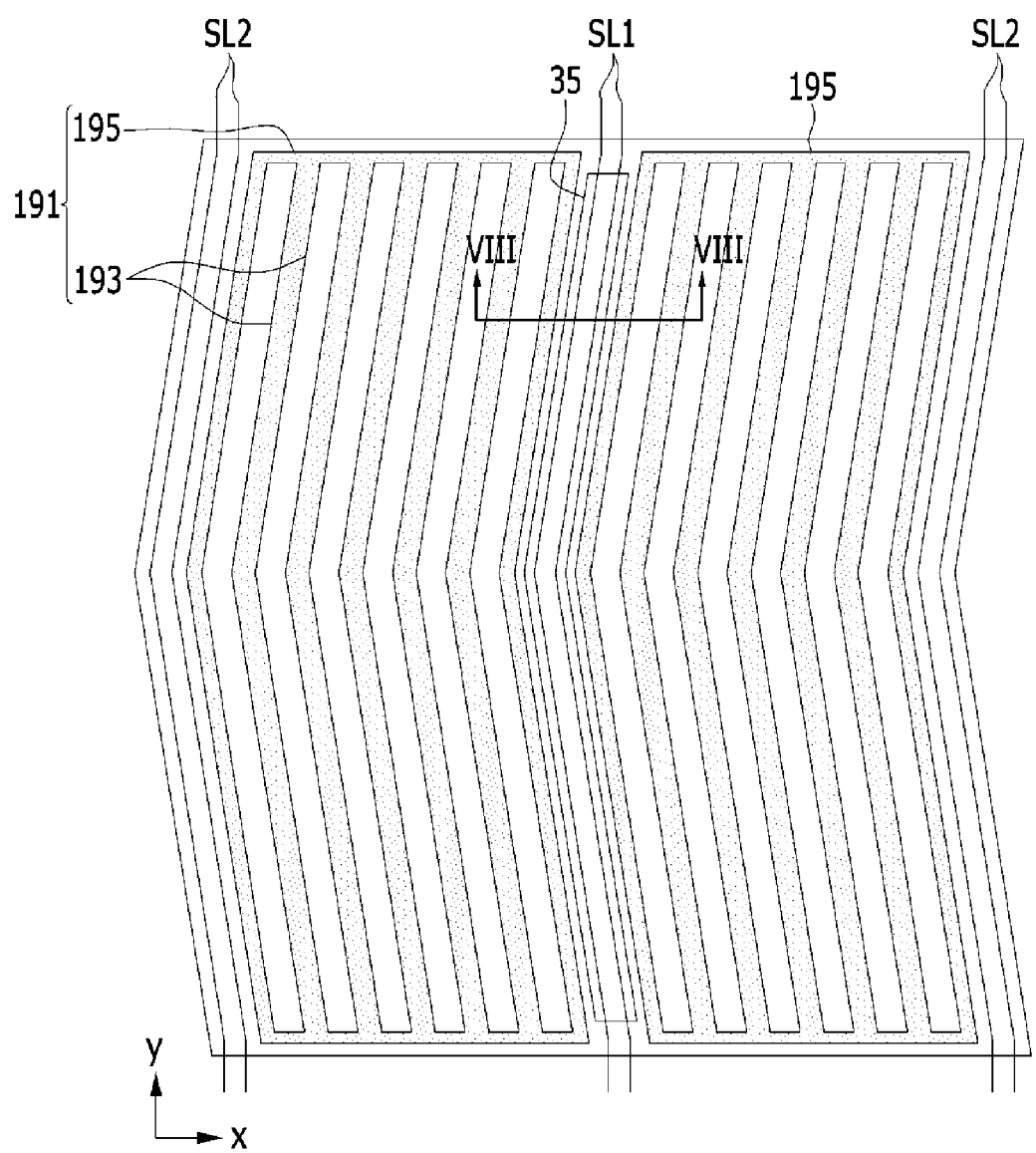
FIG. 7 is a layout view of a liquid crystal display, according to exemplary embodiments.
Figure 8:
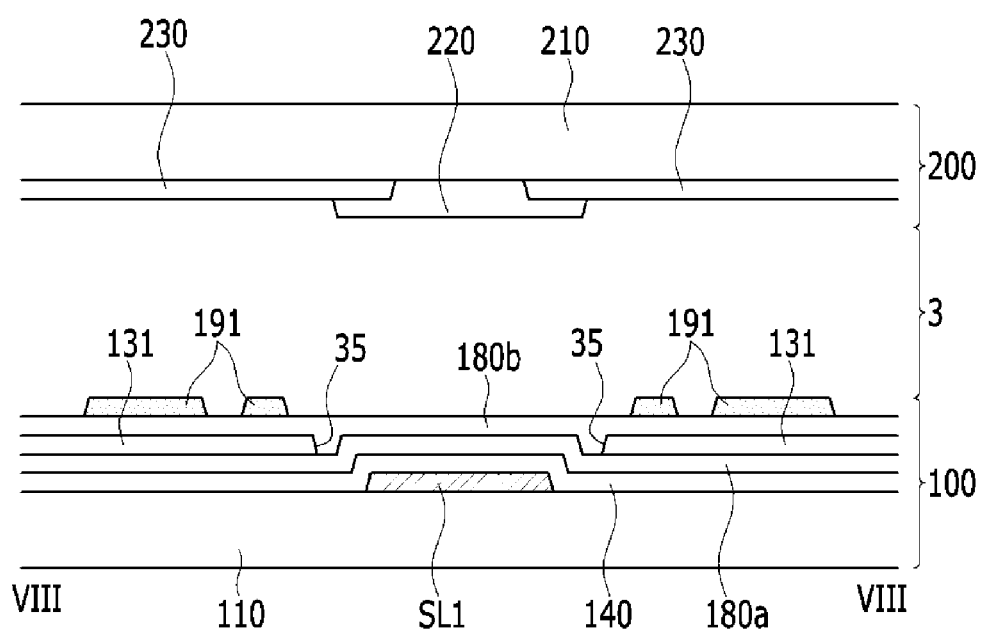
FIG. 8 is a cross-sectional view of the liquid crystal display of FIG. 7 taken along sectional line VIII-VIII, according to exemplary embodiments.

FIG. 7 is a layout view of a liquid crystal display, according to exemplary embodiments. FIG. 8 is a cross-sectional view of the liquid crystal display of FIG. 7 taken along sectional line VIII-VIII.

Referring to FIGS. 7 and 8, the liquid crystal display is substantially similar to the liquid crystal display illustrated in FIGS. 5 and 6; however, the liquid crystal display of FIGS. 7 and 8 includes an alternatively configured common electrode 131. Accordingly, to avoid obscuring exemplary embodiments described herein, duplicative descriptions of similarly configured features are omitted.

As seen in FIGS. 7 and 8, the common electrode 131 may include a plurality of openings 35 elongated substantially in the y-direction. In FIG. 7, while only the portion of the common electrode 131 disposed over the first signal line SL1 includes opening 35, it is contemplated that the portion of the common electrode 131 disposed over the second signal line SL2 may also include an opening 35. According to exemplary embodiments, the longitudinal extension of the opening 35 may be curved (or otherwise bent) in the x-direction. Alternatively, the opening 35 may be straight or substantially straight.

A width of the opening 35 in the x-direction may be larger, smaller, or equal to the width of the first signal line SL1 or the second signal line SL2 in the x-direction. In this manner, the opening 35 may expose the edge side(s) of the first signal line SL1 or the second signal line SL2, or may cover at least one edge side thereof.

A more detailed structure of a liquid crystal display will now be described with reference to FIGS. 9-12. To avoid obscuring exemplary embodiments described herein, duplicative descriptions are omitted.

Figure 9:
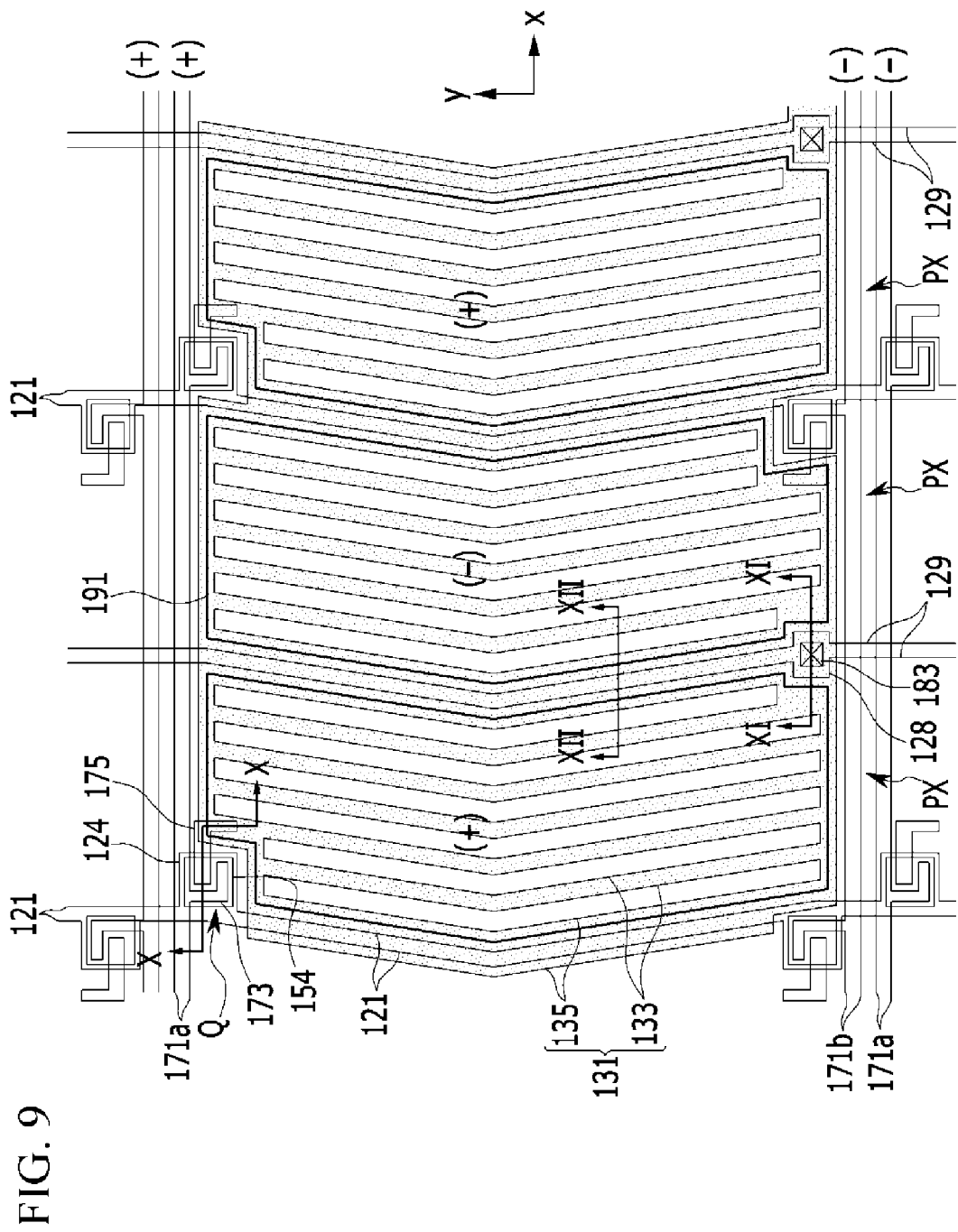
FIG. 9 is a layout view of a liquid crystal display, according to exemplary embodiments.
Figure 10:
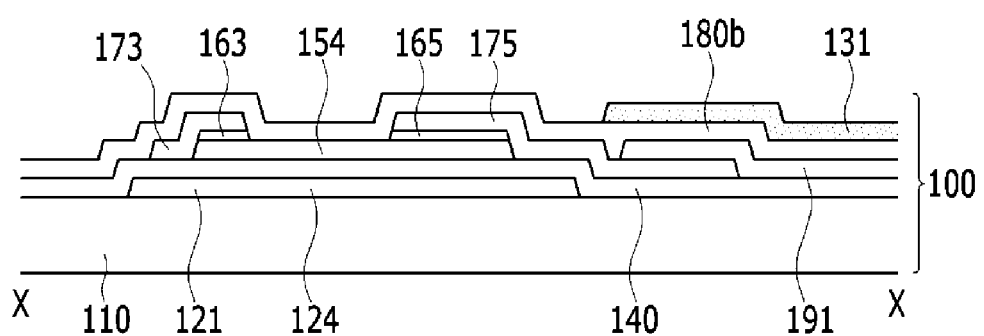
FIG. 10 is a cross-sectional view of the liquid crystal display of FIG. 9 taken along sectional line X-X, according to exemplary embodiments.
Figure 11:
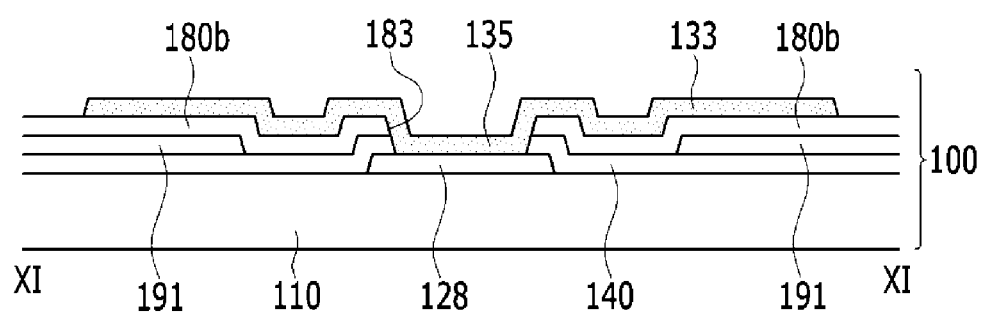
FIG. 11 is a cross-sectional view of the liquid crystal display of FIG. 9 taken along sectional line XI-XI, according to exemplary embodiments.
Figure 12:
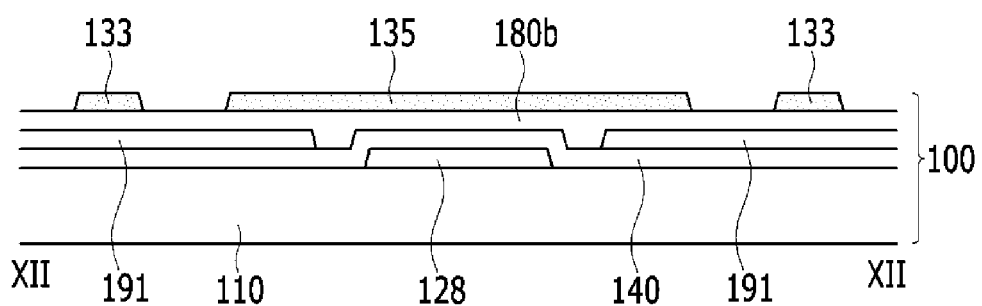
FIG. 12 is a cross-sectional view of the liquid crystal display of FIG. 9 taken along sectional line XII-XII, according to exemplary embodiments.

FIG. 9 is a layout view of a liquid crystal display, according to exemplary embodiments. FIG. 10 is a cross-sectional view of the liquid crystal display of FIG. 9 taken along sectional line X-X. FIG. 11 is a cross-sectional view of the liquid crystal display of FIG. 9 taken along sectional line XI-XI. FIG. 12 is a cross-sectional view of the liquid crystal display of FIG. 9 taken along sectional line XII-XII.

As seen in FIGS. 9-12, the liquid crystal display includes the lower panel 100 and the upper panel 200 facing each other, and the liquid crystal layer 3 disposed therebetween. The upper panel 200 and the liquid crystal layer 3 are configured as those previously described, and, therefore, a detailed description of these components has been omitted.

Lower panel 100, according to exemplary embodiments, includes a plurality of gate conductors, including a plurality of gate lines 121 and a plurality of common voltage lines 129 disposed on an insulation substrate 110.

The gate line 121 transmits the gate signal and longitudinally extends in substantially the y-direction. As seen in, for instance, FIG. 9, the gate line 121 may be curved (or otherwise bent) in the x-direction, or may be straight or substantially straight. Each gate line 121 includes a plurality of gate electrodes 124.

The common voltage line 129 transmits a common voltage and longitudinally extends in substantially the y-direction. In this manner, the common voltage line 129 may be substantially parallel to the gate line 121. As such, the common voltage line 129 may be curved (or otherwise bent) in the x-direction, or may be straight or substantially straight. Each common voltage line 129 may include a plurality of expansions 128.

According to exemplary embodiments, the gate line 121 and the common voltage line 129 are alternately arranged in the x-direction and are disposed in each pixel array in the x-direction; however, the gate line 121 and the common voltage line 129 may be alternatively arranged. FIG. 9 illustrates one gate line 121 being disposed in association with two pixel arrays. Further, as shown in FIG. 9, the gate line 121 and the common voltage line 129 may be periodically curved (or otherwise bent) in the y-direction.

A gate insulating layer 140 is disposed on the gate conductor. A semiconductor 154 is disposed on the gate insulating layer 140. The semiconductor 154 may be made of (or otherwise include) any suitable material, such as, for example, amorphous silicon, crystalline silicon, an oxide, etc.

A pair of ohmic contacts 163 and 165 may be disposed on each semiconductor 154. The ohmic contacts 163 and 165 may be made of (or otherwise include) any suitable material, such as, for instance, n+ hydrogenated amorphous silicon (a-Si), which may be heavily doped with an N-type impurity, such as, for example, phosphorous. Alternatively, the pair of ohmic contacts 163 and 165 may be made of a silicide. It is also contemplated that the ohmic contacts 163 and 165 may be omitted.

A data conductor, including a plurality of pairs of first and second data lines 171a and 171b, and a plurality of drain electrodes 175 may be formed on the ohmic contacts 163 and 165. The first and second data lines 171a and 171b transmit the data signal and longitudinally extend in substantially the x-direction, and, thereby, intersect the gate line 121 and the common voltage line 129. The first and second data lines 171a and 171b respectively include a plurality of source electrodes 173 extending toward the gate electrodes 124.

According to exemplary embodiments, a pair of first and second data lines 171a and 171b may be disposed in association with one row of pixels PX. The first data line 171a and the second data line 171b may alternately extend in the y-direction. The pixels PX of one row of pixels PX may be disposed between a pair of first and second data lines 171a and 171b. As seen in FIG. 9, however, the first data line 171a is disposed at an upper side of one row of pixels PX and the second data line 171b is disposed at a lower side of the row of pixels PX. The first and second data lines 171a and 171*b* disposed between rows of pixels PX adjacent to each other in the y-direction may be disposed relatively close to each other.

The drain electrode 175 includes a bar-type end and another end including a wide area, which opposes the source electrode 173 with respect to the gate electrode 124.

The gate electrode 124, the source electrode 173, and the drain electrode 175 form a thin film transistor Q, such as a switching element, along with the semiconductor 154. A portion of the semiconductor 154 not covered by the source electrode 173 and the drain electrode 175 is exposed to form a channel region of the thin film transistor Q. As shown in FIG. 9, the thin film transistors Q of the pixels PX of a row may be alternately connected to the first and second data lines 171*a* and 171*b* disposed at the upper and lower sides, however, any other suitable arrangement may be utilized.

According to exemplary embodiments, a plurality of pixel electrodes 191 is disposed on the drain electrode 175. In this manner, a pixel electrode 191 is disposed in association with each pixel PX and may exhibit a planar shape, e.g., a polygonal shape, including edges that extend parallel to the gate line 121 and the common voltage line 129. The length of the pixel electrode 191 in the y-direction may be longer than the length in the x-direction. That is, the length of one pixel PX in the y-direction may be longer than the length in the x-direction.

Each pixel electrode 191 may be disposed between the gate line 121 and the common voltage line 129; however, any other suitable arrangement may be utilized. The pixel electrode 191 may not overlap with the gate line 121 or the common voltage line 129. The pixel electrode 191 may contact the drain electrode 175, and, thereby, may be configured to receive the data voltage from the drain electrode 175. The remaining configuration of the pixel electrode 191 is substantially the same as previously described in association with FIGS. 1 and 2, and, therefore, a corresponding detailed description has been omitted.

According to exemplary embodiments, the first passivation layer 180*a* may be further disposed between the pixel electrode 191 and the drain electrode 175. In this manner, the pixel electrode 191 may be electrically connected to the drain electrode 175 through a contact hole in the first passivation layer 180*a*.

The second passivation layer 180*b* may be disposed on the pixel electrode 191. The second passivation layer 180*b* and the gate insulating layer 140 include a contact hole 183 exposing the expansion 128 of the common voltage line 129.

A common electrode 131 may be disposed on the second passivation layer 180*b*. Corresponding portions of the common electrode 131 overlap with the pixel electrode 191 of each pixel PX and includes a plurality of branch electrodes 133 substantially extending parallel to each other and separated from each other. The common electrode 131 may also include a boundary portion 135 overlapping with the gate line 121 or the common voltage line 129. The boundary portion 135 may be disposed near a boundary of adjacently disposed pixels PX neighboring each other in the x-direction. The boundary portion 135 may cover the gate line 121 and the common voltage line 129. The branch electrode 133 and the boundary portion 135 of the common electrode 131 may substantially extend parallel to the gate line 121 and the common voltage line 129.

According to exemplary embodiments, the common electrode 131 contacts the expansion 128 of the common voltage line 129 via the contact hole 183, and, thereby, is electrically connected thereto. Accordingly, non-uniformity in the common voltage induced by resistance in the common electrode 131 may be reduced. The remainder of the configuration of the common electrode 131 is the same as previously described, and, therefore, a corresponding detailed description has been omitted.

According to exemplary embodiments, the length in the y-direction of each pixel PX is longer than the length in the x-direction, and the branch electrodes 133 of the common electrode 131 may substantially extend in the y-direction. As compared to branch electrodes 133 extending in the x-direction, a disclination region that may be generated at or near an end portion of the slit between branch electrodes 133 may be decreased, such that the transmittance of the liquid crystal display may be increased.

In exemplary embodiments, the gate line 121 overlapping with the boundary portion 135 of the common electrode 131 may be disposed in a layer closest to the insulation substrate 110 among the layers in which the several terminals of the thin film transistor Q are disposed. For instance, the gate line 121 may be disposed under the gate insulating layer 140, and may be disposed directly on the insulation substrate 110. As such, a distance between the gate line 121 and the boundary portion 135 of the common electrode 131 or the pixel electrode 191 may be at a maximum. The parasitic capacitance between the gate line 121 and the boundary portion 135 of the common electrode 131 or the pixel electrode 191 may, thereby, be reduced, and, as such, the signal delay of the gate line 121 may be correspondingly minimized (or otherwise reduced). Further, crosstalk between the gate line 121 and the boundary portion 135 of the common electrode 131 or the pixel electrode 191 may be reduced, such that light leakage resulting, at least in part, from electric field distortions may also be reduced.

According to exemplary embodiments, since the parasitic capacitance between the gate line 121 and the boundary portion 135 of the common electrode 131 or the pixel electrode 191 may be reduced, it is not necessary to form an insulating layer made of an organic insulating material between the gate line 121 and the common electrode 131 or the pixel electrode 191. In other words, the first passivation layer 180*a* may not include an organic insulating material. When, for example, the insulating layer of the first passivation layer 180*a* is formed of an inorganic insulating material, a material cost may be reduced, as compared with instances when an organic insulating material is utilized and a processing step, such as a deposition and photo-processing is utilized, processing time to manufacture the corresponding liquid crystal display may be reduced. Furthermore, undesirable absorption of incident light by an organic insulating material may be reduced, such that the transmittance of the liquid crystal display may be further increased. To this end, it is also not necessary to form a contact hole in a comparatively thick organic insulating material, such that an aperture ratio is not undesirably reduced. Moreover, in exemplary embodiments, the first passivation layer 180*a* is not formed, such that the manufacturing cost and the manufacturing time may be further reduced.

An operation of the liquid crystal display, according to exemplary embodiments, will be described with reference to FIG. 9.

According to exemplary embodiments, if the gate signal transmitted by the gate line 121 is the gate-on voltage, the thin film transistor Q connected to the gate line 121 may be turned on. In this manner, the data voltage applied to the first and second data lines 171*a* and 171*b* may be applied to the corresponding pixel electrode 191 via the "turned-on" thin film transistor Q. A difference between the data voltage applied to the pixel electrode 191 and the common voltage applied to the common electrode 131 may be considered as representing a pixel voltage. The liquid crystal molecules of liquid crystal layer 3 may be oriented depending on the magnitude of the pixel voltage, and, accordingly, polarization of incident light propagating through the liquid crystal layer 3 may vary. Such variation of the polarization appears as a variation in transmittance of light due to a polarizer (not shown), which may be coupled to the display panel, and, thereby, the pixel PX may display an image.

In association with a unit of the horizontal period 1H, the gate-on voltage may be sequentially applied to all the gate lines 121, and the data voltage may be applied to all the pixels PX, so as to display an image of one frame. Once presentation of one frame is finished, the next frame may be started, and the polarity of the data voltage applied to each pixel PX for the common voltage (hereinafter referred to as a polarity of the data voltage) may become opposite to the polarity of the previous frame.

According to exemplary embodiments, during one frame, the polarity of the data voltage respectively transmitted by the first and second data lines 171a and 171b may be uniform. Also, during one frame, at least two of the plurality of first and the second data lines 171a and 171b may transmit data voltages of different polarities. FIG. 9 is illustrates an example in which a pair of the first and second data lines 171a and 171b opposing each other with respect to one row of pixels PX transmit data voltages of different polarities during one frame. In this manner, the first and second data lines 171a and 171b adjacent to each other may transmit data voltages of the same polarity during one frame. As shown in FIG. 9, the thin film transistors Q of a pixel PX of a row of pixels PX may be alternately connected to the first and second data lines 171a and 171b, and the pixels PX connected to the adjacent first and second data lines 171a and 171b may be adjacent in a diagonal direction, such that one-by-one (1×1) dot inversion occurs, in which the polarities of the data voltages applied to the pixels PX adjacent in the x-direction or the y-direction are opposite to each other. In this manner, display quality degradation may be reduced.

According to exemplary embodiments, while the polarities of the data voltages transmitted by the first and second data lines 171a and 171b during one frame are uniform, various polarity inversions may be realized by applying the data voltages of the different polarities according to the positions of the first and second data lines 171a and 171b. As such, the power consumption of the data driving may be reduced.

Another operation of the liquid crystal display, according to exemplary embodiments, will be described with reference to FIGS. 13 and 14.

Figure 13:
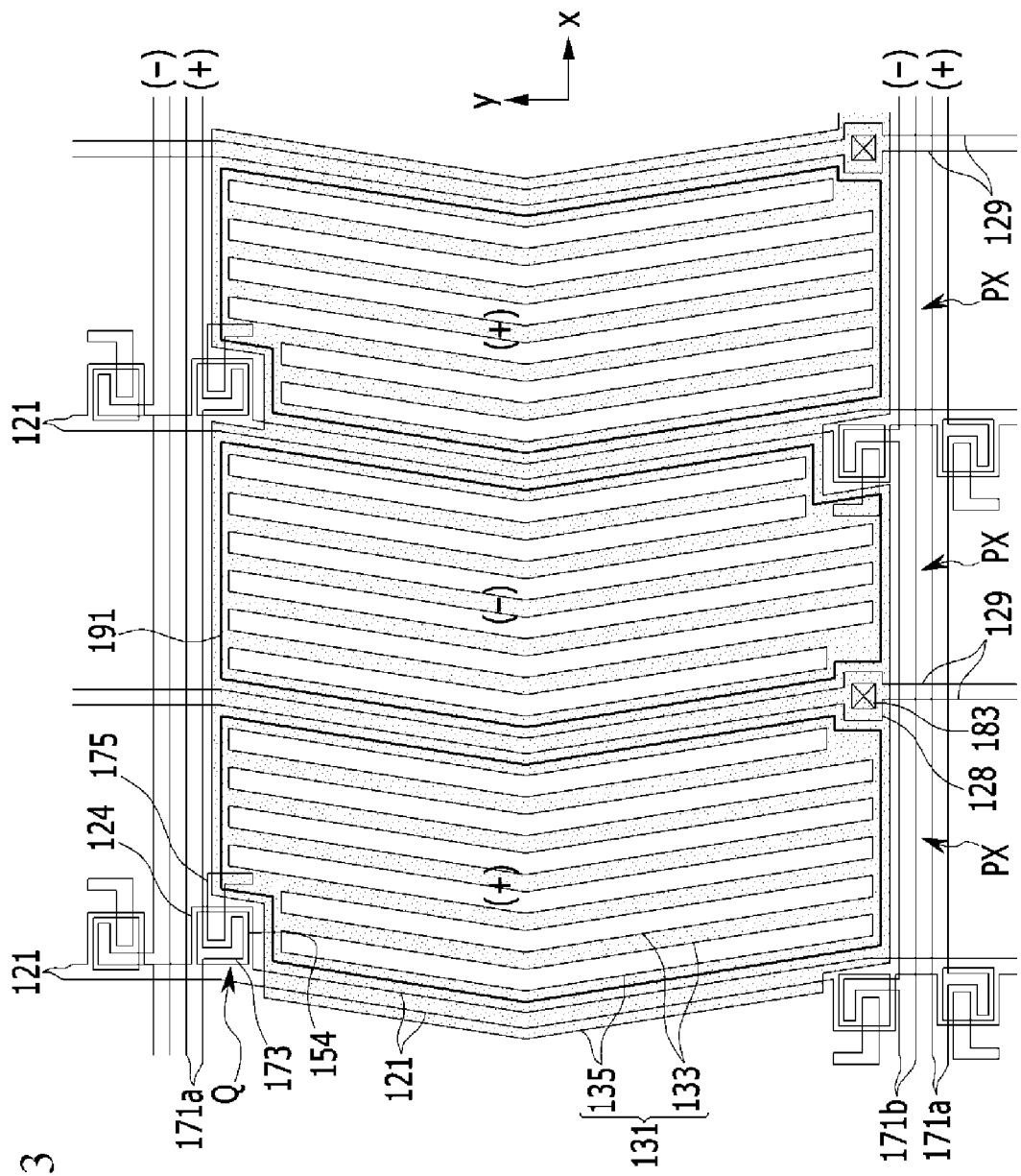
FIGS. 13 and 14 are layout views of a polarity of a data voltage in a liquid crystal display, according to exemplary embodiments.
Figure 14:
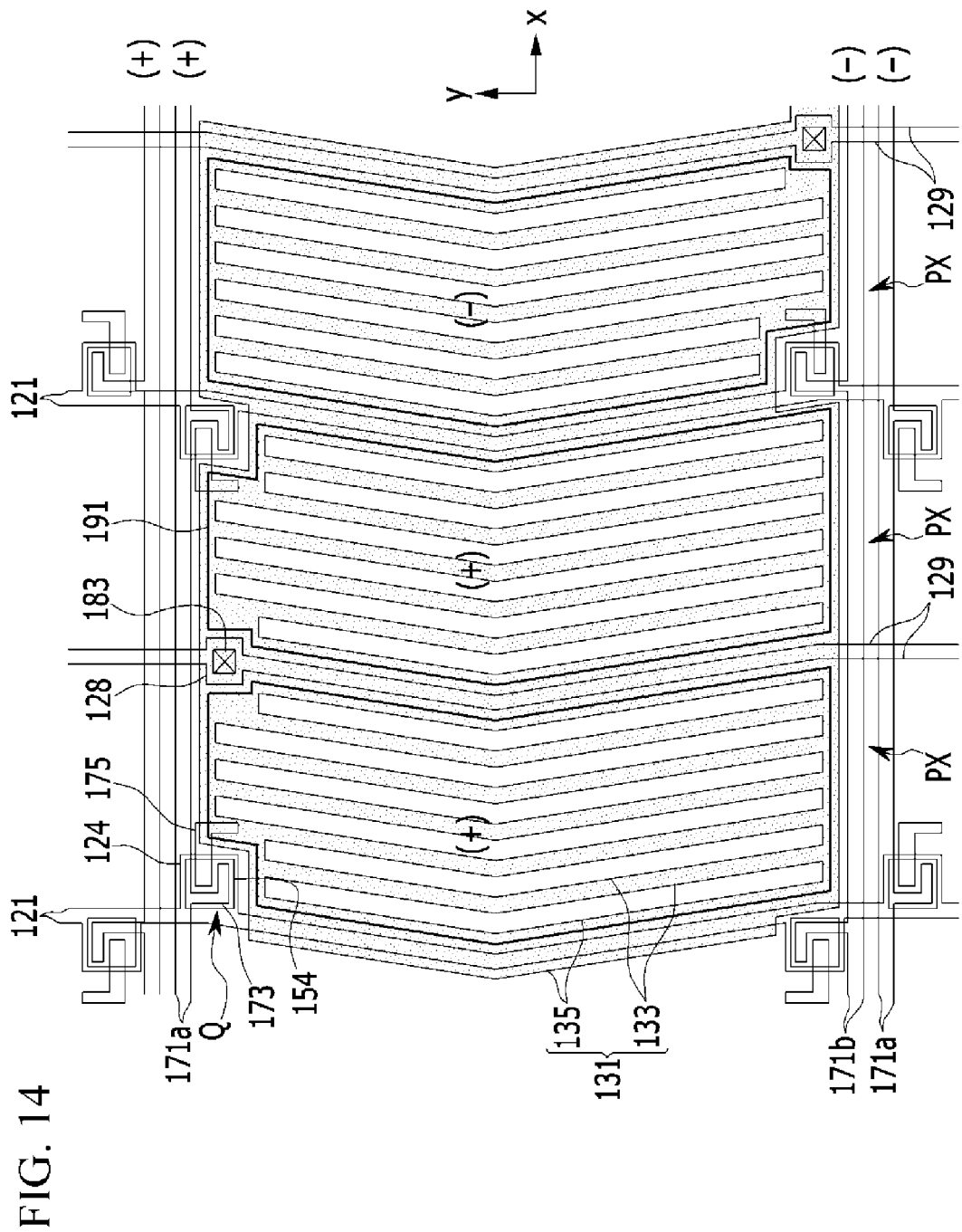

FIGS. 13 and 14 are respective layout views of a polarity of a data voltage in a liquid crystal display, according to exemplary embodiments.

Referring to FIG. 13, the operation of the liquid crystal display may be substantially similarly as previously described in association with FIG. 9, and therefore, duplicative descriptions have been omitted. In this manner, differences are described below.

The polarity of the data voltage transmitted by the first and second data lines 171a and 171b during one frame may be constant; however the polarities of the data voltages transmitted by the adjacent first and second data lines 171a and 171b may be opposite to each other. Accordingly, the polarities of the data voltages transmitted to a pair of the first and second data lines 171a and 171b opposing each other with respect to one row of pixels PX may be different, and the polarities of the data voltages transmitted to the first and second data lines 171a and 171b adjacent to each other may be different. As shown in FIG. 13, the thin film transistors Q of the pixels PX of a row may be alternately connected to the first and second data lines 171a and 171b, and the pixels PX connected to the first and second data lines 171a and 171b adjacent to each other are adjacent in the y-direction, such that one-by-one (1×1) dot inversion, in which the polarities of the data voltages applied to the pixels PX adjacent in the x-direction or the y-direction are opposite to each other may be realized. As such, display quality degradation may be reduced.

Referring to FIG. 14, the operation of the liquid crystal display may be substantially the same as previously described in association with FIG. 9, and, therefore, duplicative descriptions have been omitted. As such, differences are described below.

According to exemplary embodiments, the polarities of the data voltages transmitted to the first and second data lines 171a and 171b are the same as the exemplary embodiment shown in FIG. 9. The thin film transistors Q of the pixels PX of one pixel row are alternately connected to the first and second data lines 171a and 171b by two units, and the pixels PX connected to the first and second data lines 171a and 171b are adjacent to each other in a diagonal direction, such that one-by-two (1×2) dot inversion may occur, in which the polarities of the data voltages applied to the pixels PX adjacent in the y-direction are opposite to each other and the polarities of the data voltages are changed by the unit of two pixels PX in the x-direction. As such, display quality degradation may be reduced.

According to exemplary embodiments, various polarity inversions may be realized by controlling the arrangement of the thin film transistor Q and the arrangement of the polarity of the data voltage transmitted to the first and second data lines 171a and 171b.

A manufacturing method of a lower panel of an exemplary liquid crystal display is described in more detail in association with FIGS. 15-18 along with FIG. 9-FIG. 12.

FIGS. 15-18 are respective layout views of a manufacturing method of the liquid crystal display of FIG. 9, according to exemplary embodiments.

Figure 15:
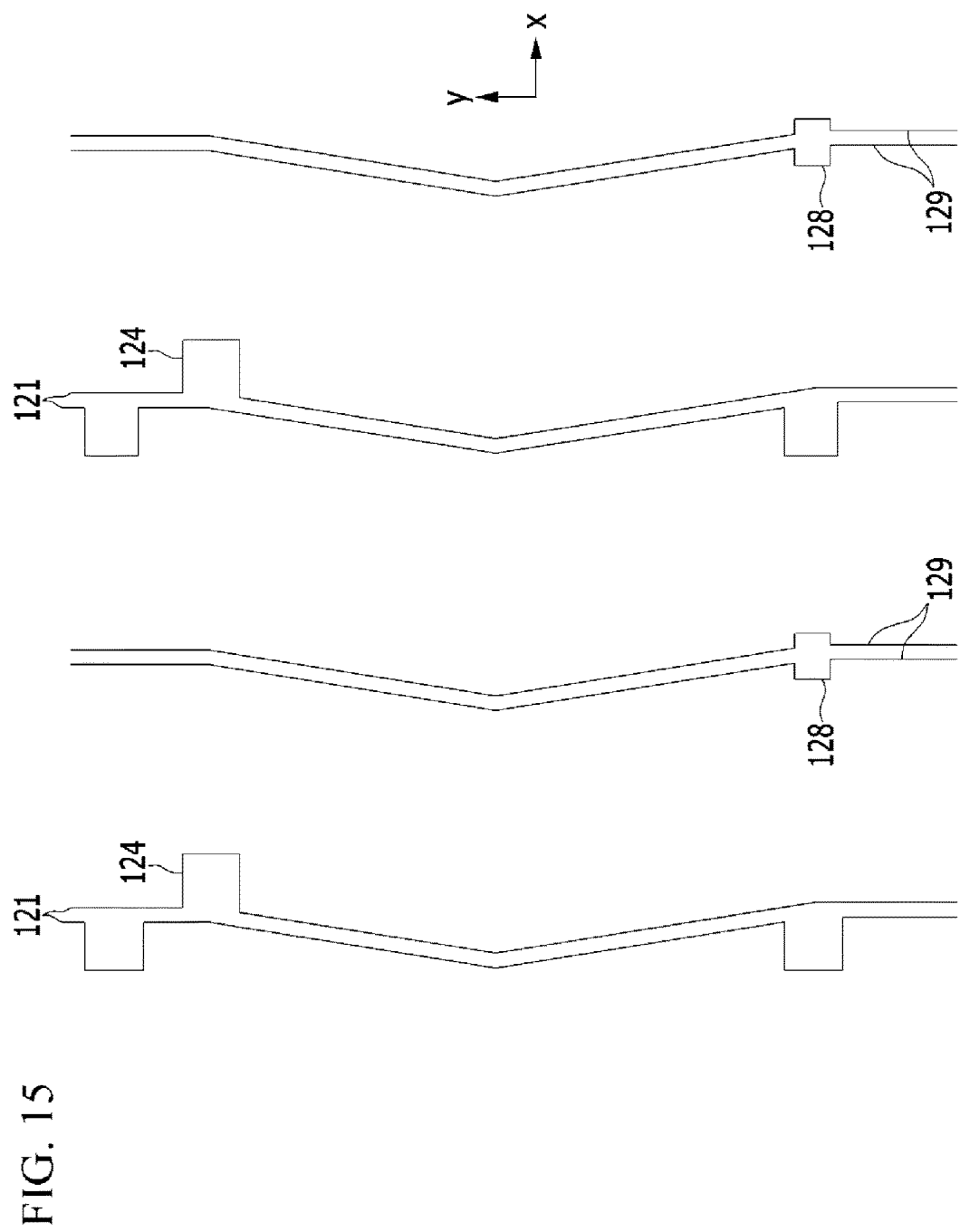
FIGS. 15-18 are layout views of a manufacturing method of the liquid crystal display of FIG. 9, according to exemplary embodiments.

Referring to FIG. 15, a conductive material, such as a metal, is deposited and patterned on an insulation substrate 110 to form a plurality of gate lines 121 including a gate electrode 124, and a plurality of common voltage lines 129 including an expansion 128.

Figure 16:
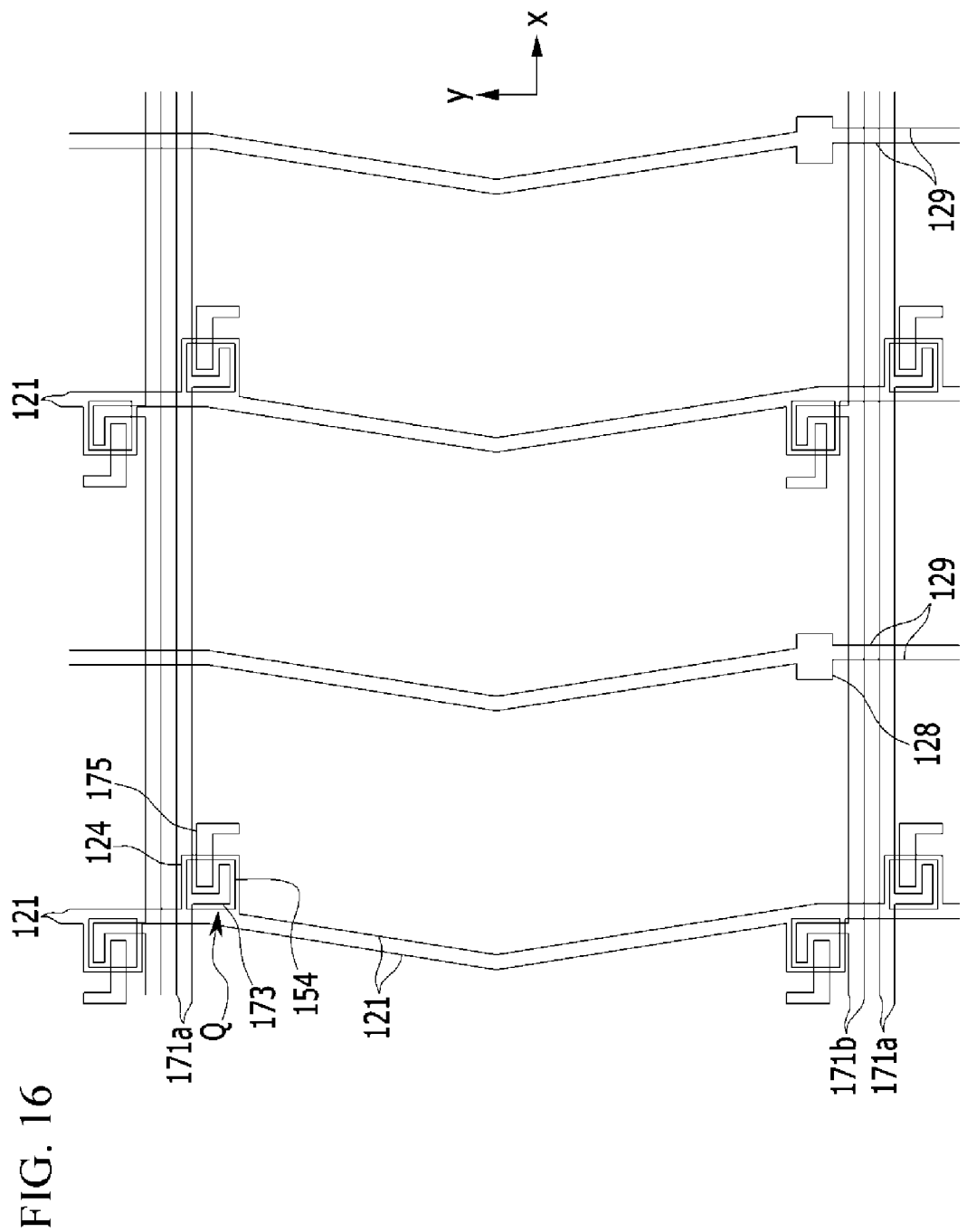

As seen in FIG. 16, a gate insulating layer 140 made of, for instance, an inorganic insulating material is deposited on the gate line 121 and the common voltage line 129. A semiconductor 154 is formed on the gate insulating layer 140. Ohmic contact islands 163 and 165 may be formed on the semiconductor 154. A conductive material, such as a metal, is deposited and patterned on the semiconductor 154 to form a plurality of pairs of the first and second data lines 171a and 171b respectively including source electrodes 173 and a plurality of drain electrodes 175.

Figure 17:
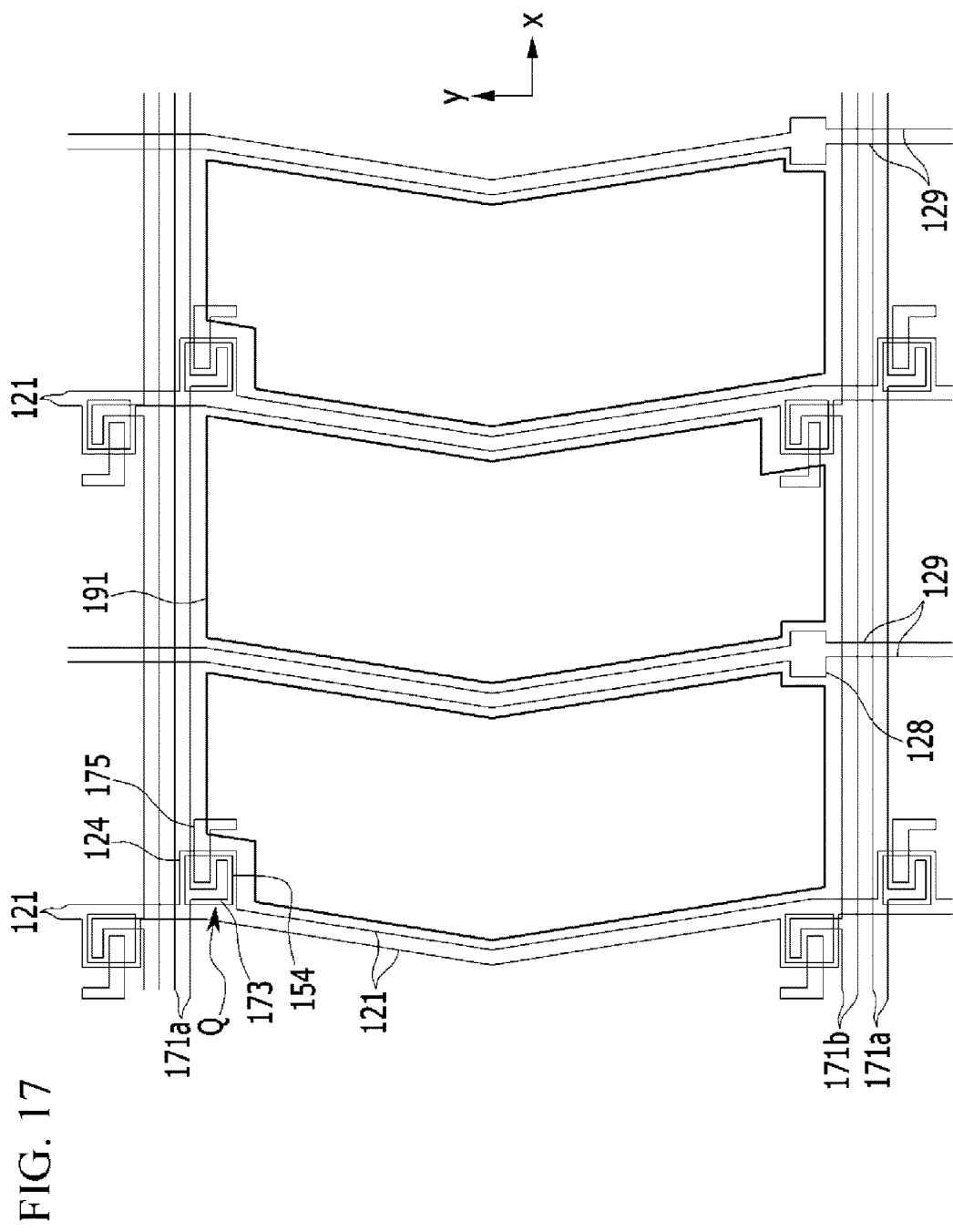

Adverting to FIG. 17, a transparent conductive material, such as AZO, GZO, ITO, IZO, etc., may be deposited and patterned on the drain electrode 175 to form a plurality of pixel electrodes 191 respectively contacting the drain electrodes 175.

Figure 18:
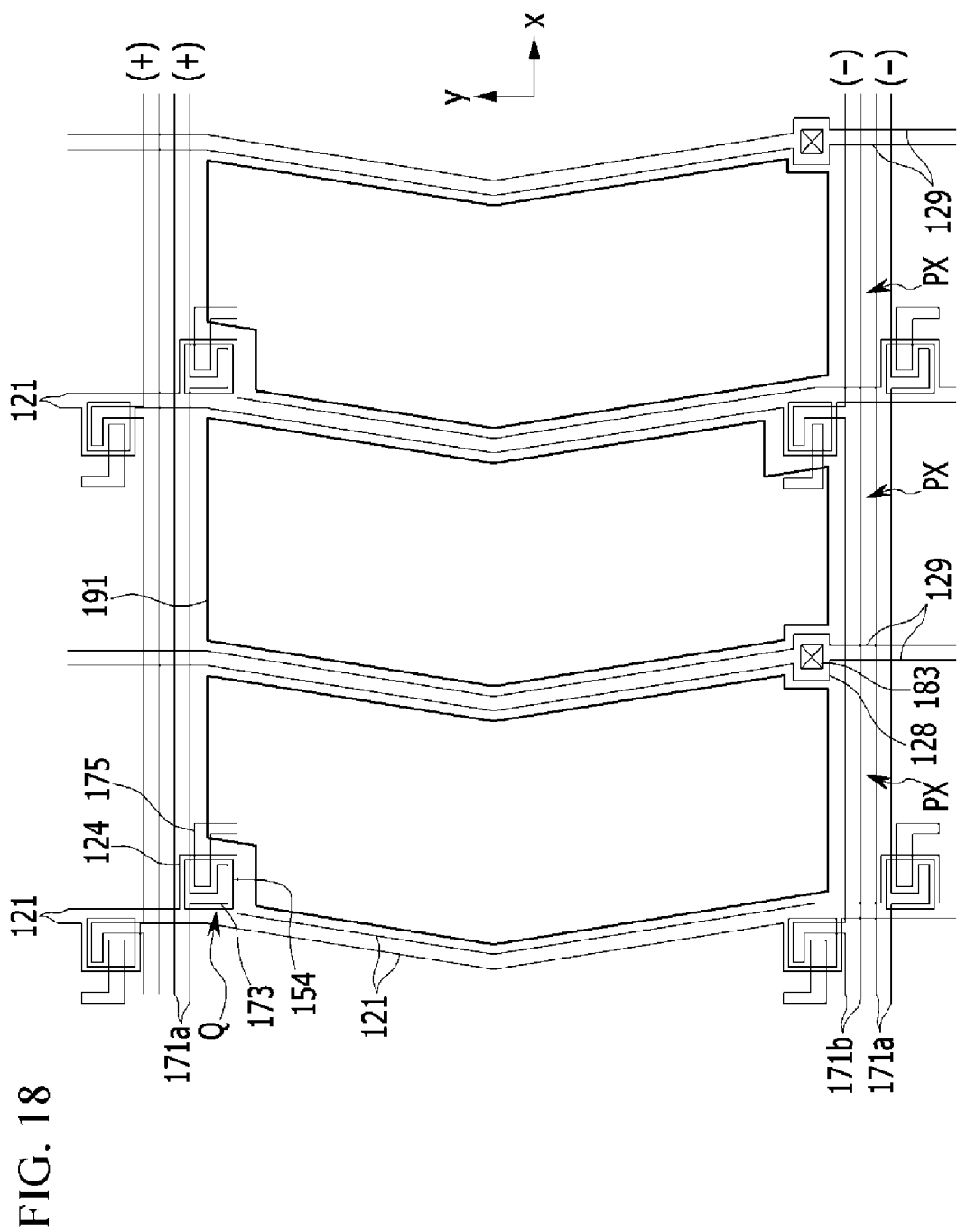

With reference to FIG. 18, an inorganic insulating material is deposited and patterned on the pixel electrode 191 to form the second passivation layer 180b including a contact hole 183.

As seen in FIG. 9, a transparent conductive material, such as AZO, GZO, ITO, IZO, etc., is deposited and patterned on the second passivation layer 180b to form a common electrode 131 overlapping with the pixel electrode 191.

Figure 19:
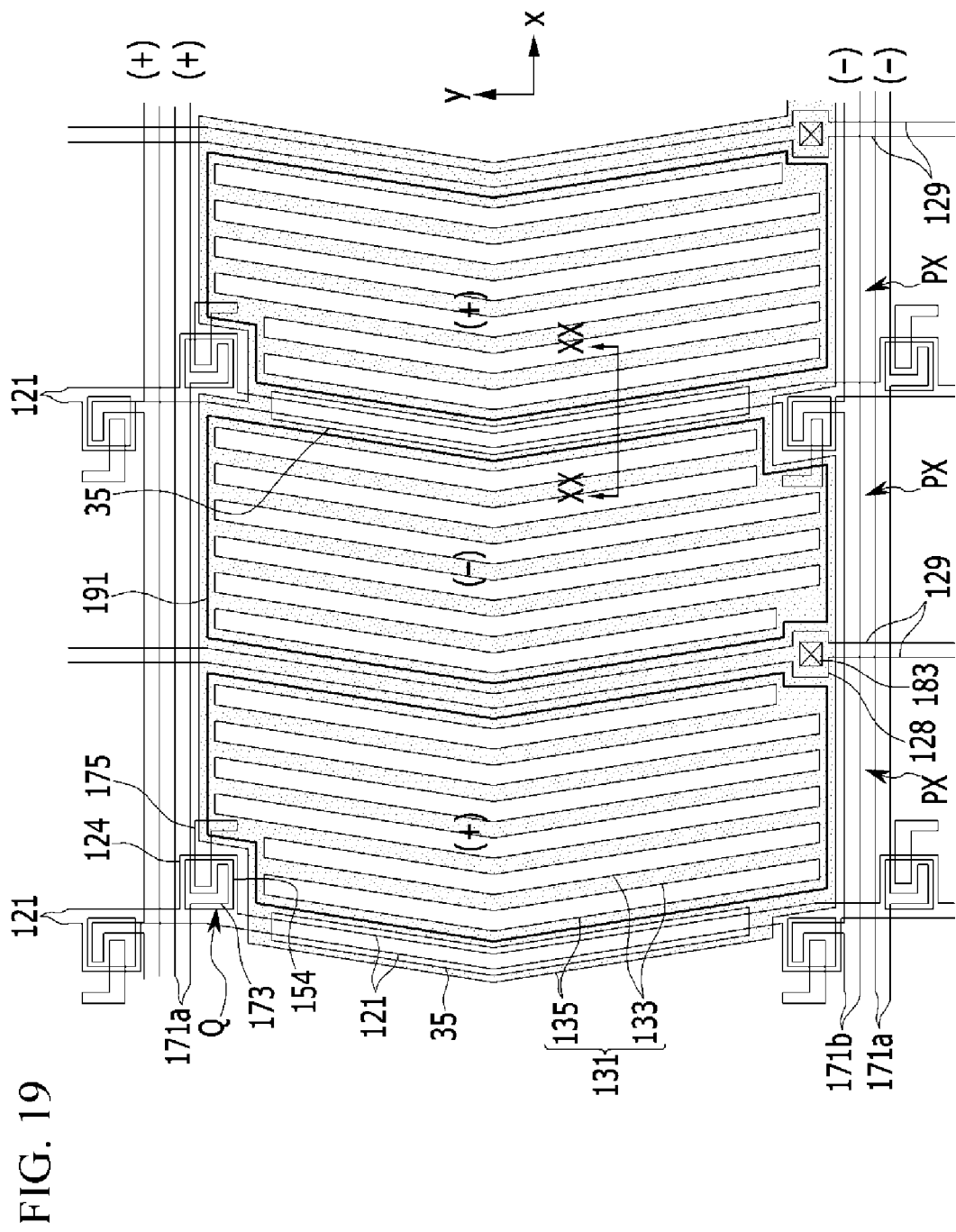
FIG. 19 is a layout view of a liquid crystal display, according to exemplary embodiments.
Figure 20:
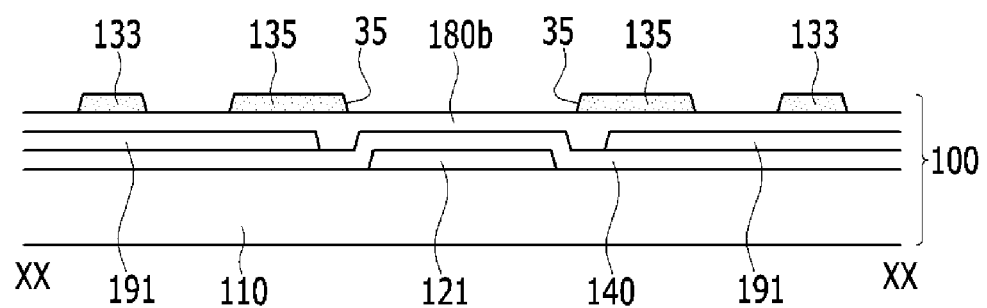
FIG. 20 is a cross-sectional view of the liquid crystal display of FIG. 19 taken along sectional line XX-XX, according to exemplary embodiments.

FIG. 19 is a layout view of a liquid crystal display, according to exemplary embodiments. FIG. 20 is a cross-sectional view of the liquid crystal display of FIG. 19 taken along sectional line XX-XX.

Referring to FIGS. 19 and 20, the liquid crystal display is substantially to the liquid crystal display illustrated in FIGS. 9-12; however, the liquid crystal display of FIGS. 19 and 20 includes an alternatively configured boundary portion 135 of the common electrode 131. Accordingly, to avoid obscuring exemplary embodiments described herein, duplicative descriptions of similarly configured features are omitted.

The boundary portion 135 of the common electrode 131 may include an opening 35 elongated substantially in the y-direction. In FIG. 19, while only the portion of the boundary portion 135 disposed on the gate line 121 includes the opening 35, it is contemplated that the portion of the boundary portion 135 disposed on the common voltage line 129 may include the opening 35. In exemplary embodiments, the longitudinal extension of the opening 35 may be curved (or otherwise bent) in the x-direction. Alternatively, the opening 35 may be straight or substantially straight.

The width of the opening 35 in the x-direction may be larger than, smaller than, or equal to the width of the gate line 121 or the common voltage line 129 in the x-direction. The opening 35 may expose the edge side(s) of the gate line 121 or the common voltage line 129, or may cover at least one edge side thereof.

Figure 21:
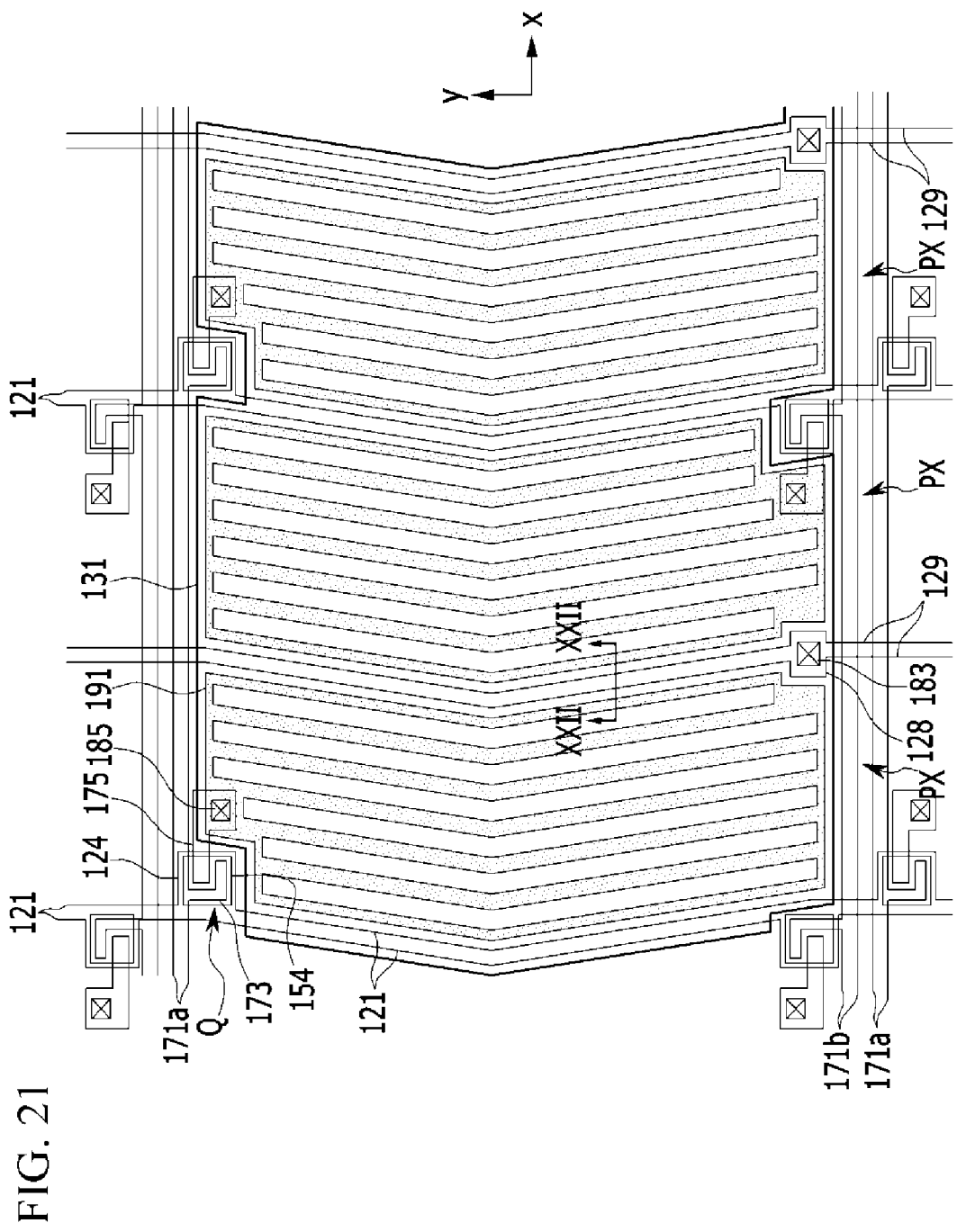
FIG. 21 is a layout view of a liquid crystal display, according to exemplary embodiments.
Figure 22:
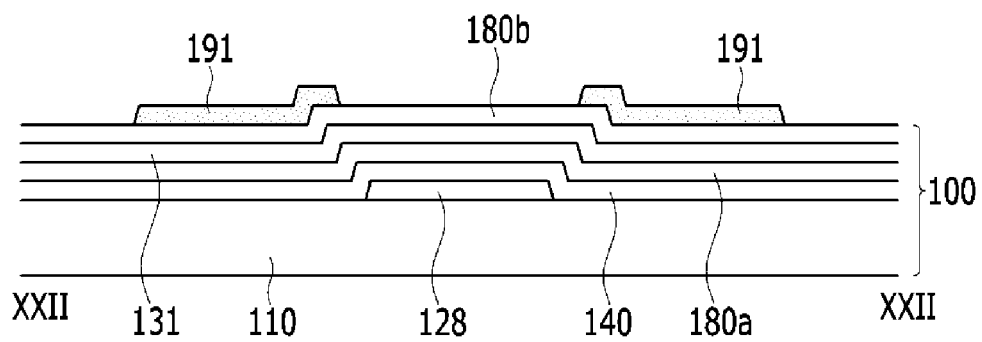
FIG. 22 is a cross-sectional view of the liquid crystal display of FIG. 21 taken along sectional line XXII-XXII, according to exemplary embodiments.

FIG. 21 is a layout view of a liquid crystal display, according to exemplary embodiments. FIG. 22 is a cross-sectional view of the liquid crystal display of FIG. 21 taken along sectional line XXII-XXII.

Referring to FIGS. 21 and 22, the liquid crystal display is substantially the same as the liquid crystal display illustrated in FIGS. 9-FIG. 12; however, the liquid crystal display of FIGS. 21 and 22 includes an alternative depositions for the common electrode 131 and the pixel electrode 191. Accordingly, to avoid obscuring exemplary embodiments described herein, duplicative descriptions of similarly configured features are omitted.

Differently than shown in FIGS. 9-12, the first passivation layer 180a is disposed on the thin film transistor Q and the common electrode 131 is disposed on the first passivation layer 180a. The second passivation layer 180b and a plurality of pixel electrodes 191 may be sequentially disposed on the common electrode 131.

The common electrode 131 may be formed on the entire surface (or a portion thereof) of the insulation substrate 110, and corresponding portions of the common electrode 131 disposed in each pixel PX may have the planar shape. In exemplary embodiments, the common electrode 131 overlaps with the gate line 121 and may also overlap with the common voltage line 129. As shown in FIGS. 21-22, the common electrode 131 may cover the gate line 121.

According to exemplary embodiments, each pixel electrode 191 overlaps with the common electrode 131 in association with a corresponding pixel PX. In this manner, each pixel electrode 191 includes a plurality of branch electrodes 193 substantially parallel to each other and separated from each other. The pixel electrode 191 may be connected to the drain electrode 175 via the contact hole 185 formed in the first passivation layer 180a and the second passivation layer 180b.

Figure 23:
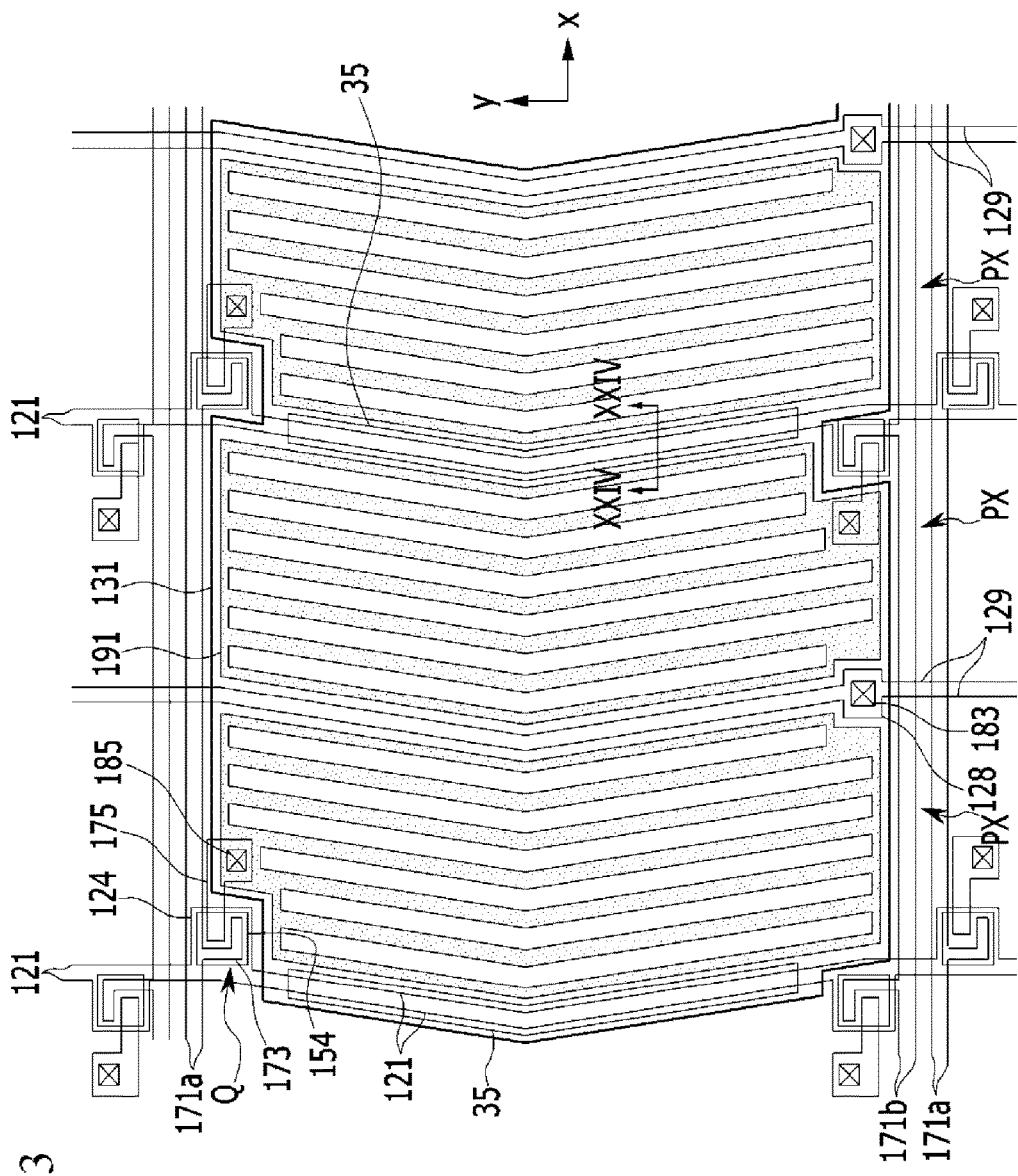
FIG. 23 is a layout view of a liquid crystal display, according to exemplary embodiments.
Figure 24:
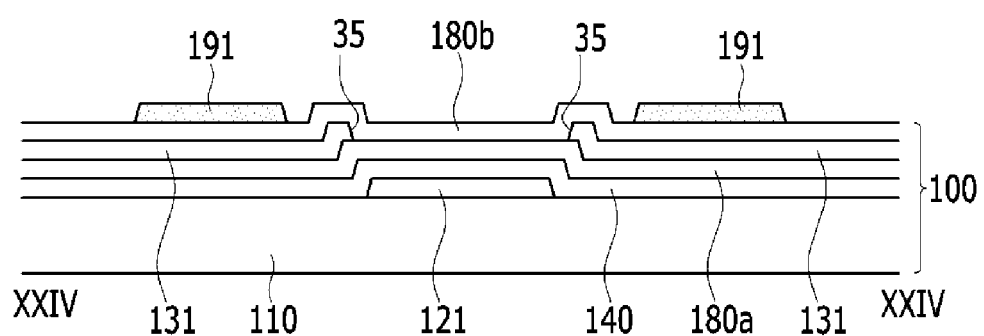
FIG. 24 is a cross-sectional view of the liquid crystal display of FIG. 23 taken along sectional line XXIV-XXIV, according to exemplary embodiments.

FIG. 23 is a layout view of a liquid crystal display, according to exemplary embodiments. FIG. 24 is a cross-sectional view of the liquid crystal display of FIG. 23 taken along sectional line XXIV-XXIV.

Referring to FIGS. 23 and 24, the liquid crystal display is substantially the same as the liquid crystal display illustrated in FIGS. 21 and 22; however, the liquid crystal display of FIGS. 23 and 24 includes a differently configured common electrode 131. Accordingly, to avoid obscuring exemplary embodiments described herein, duplicative descriptions of similarly configured features are omitted.

As seen in FIGS. 23 and 24, the common electrode 131 may include a plurality of openings 35 longitudinally elongated in substantially the y-direction. As seen in, for instance, FIG. 23, the opening 35 may be curved (or otherwise bent) in the x-direction; however, it is also contemplated that the opening 35 may be straight or substantially straight. While the opening 35 is only disposed on the gate line 121, it is contemplated that the common electrode 131 disposed on the common voltage line 129 may include an opening 35.

The width of the opening 35 in the x-direction may be larger than, smaller than, or equal to the width of the gate line 121 or the common voltage line 129 in the x-direction. The opening 35 may expose the edge side(s) of the gate line 121 or the common voltage line 129, or may cover at least one edge side thereof.

Figure 25:
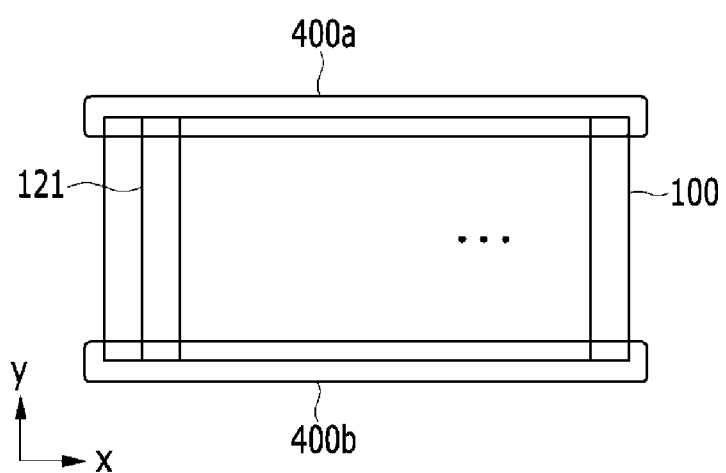
FIG. 25 is a block diagram of a liquid crystal display, according to exemplary embodiments.

FIG. 25 is a block diagram of a liquid crystal display, according to exemplary embodiments.

Referring to FIG. 25, a lower panel 100 of a liquid crystal display is connected to gate drivers 400a and 400b, and, thereby, is configured to receive gate signals from one or more of the gate drivers 400a and 400b. In FIG. 25, the gate drivers 400a and 400b are disposed at (or near) the upper side and the lower side of the lower panel 100. It is contemplated, however, that the gate drivers 400a and 400b may be disposed in any other suitable arrangement, such as, for instance, on only one side of the lower panel 100.

According to exemplary embodiments, the length of the lower panel 100 in the x-direction may be longer than the length in the y-direction, as shown in FIG. 25. In this manner, as compared with the gate line 121 longitudinally extending in the x-direction, the gate line 121 longitudinally extends in substantially the y-direction, such that the length of the gate line 121 is short and a number of thin film transistors Q connected to each gate line 121 may be reduced, which, thereby, reduces the delay of the gate signal. In exemplary embodiments, the longitudinal extension of the gate line 121 may be curved (or otherwise bent) in the x-direction; however, it is also contemplated that the gate line may be straight or substantially straight.

It is also noted that, when integrating the gate drivers 400a and 400b configured to apply the gate signals to the gate lines 121 on the insulation substrate 110, an area to form the gate drivers 400a and 400b may be increased as compared to instances when the gate line 121 longitudinally extends in the x-direction. As such, there exists greater design freedom in choosing where the gate drivers 400a and 400b are to be disposed. Accordingly, the width of the upper and lower edge regions (e.g., bezel regions) of the lower panel 100 may be reduced. Further, as compared to instances when the data line 171 longitudinally extends in substantially the y-direction, the data line 171 longitudinally extends in substantially the x-direction. As such, the number of data lines 171 and the number of data driving circuit chips configured to apply the data signal to the data lines 171 may be reduced. This also reduces the cost of and manufacturing time for the corresponding liquid crystal display.

Figure 26:
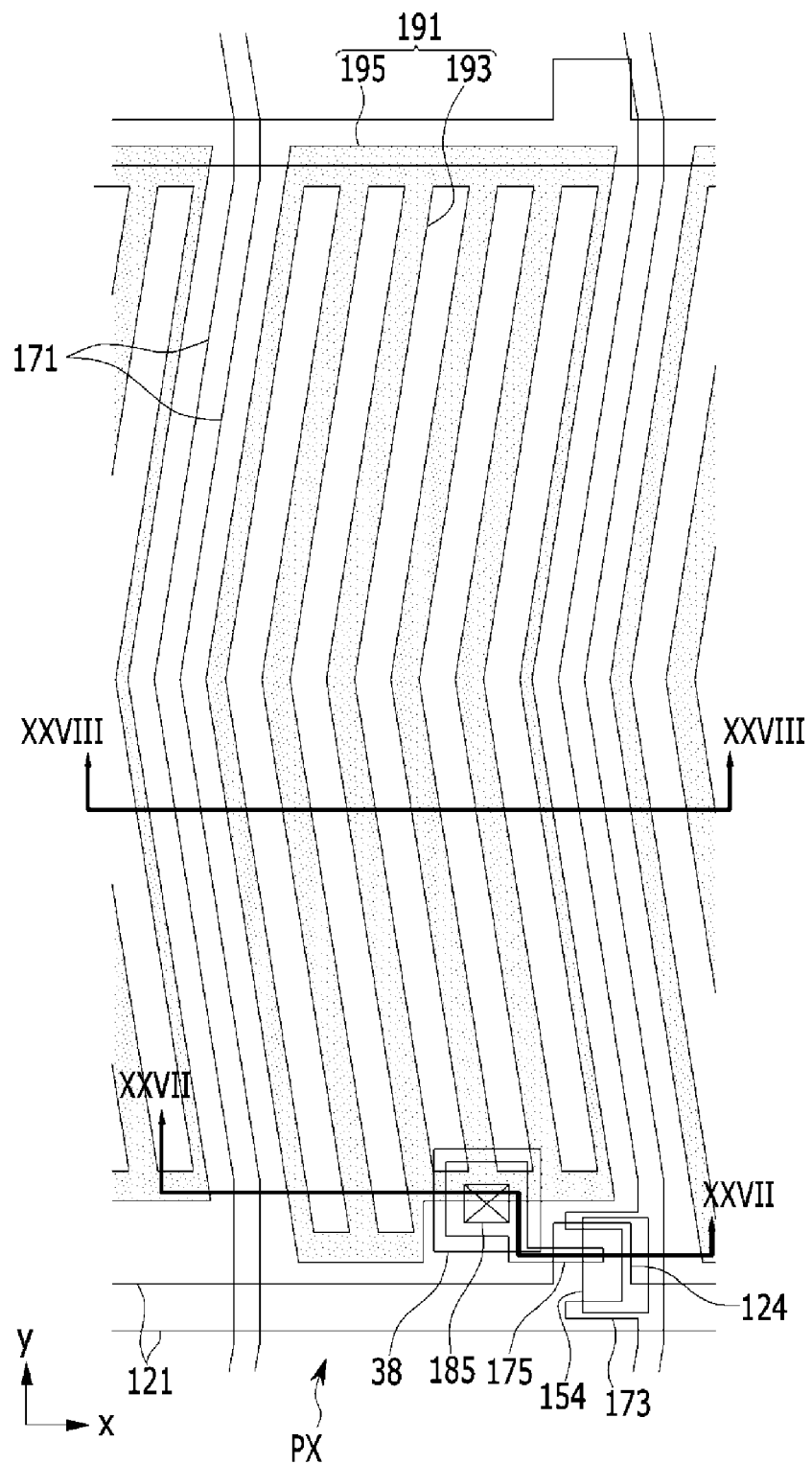
FIG. 26 is a layout view of a liquid crystal display, according to exemplary embodiments.
Figure 27:
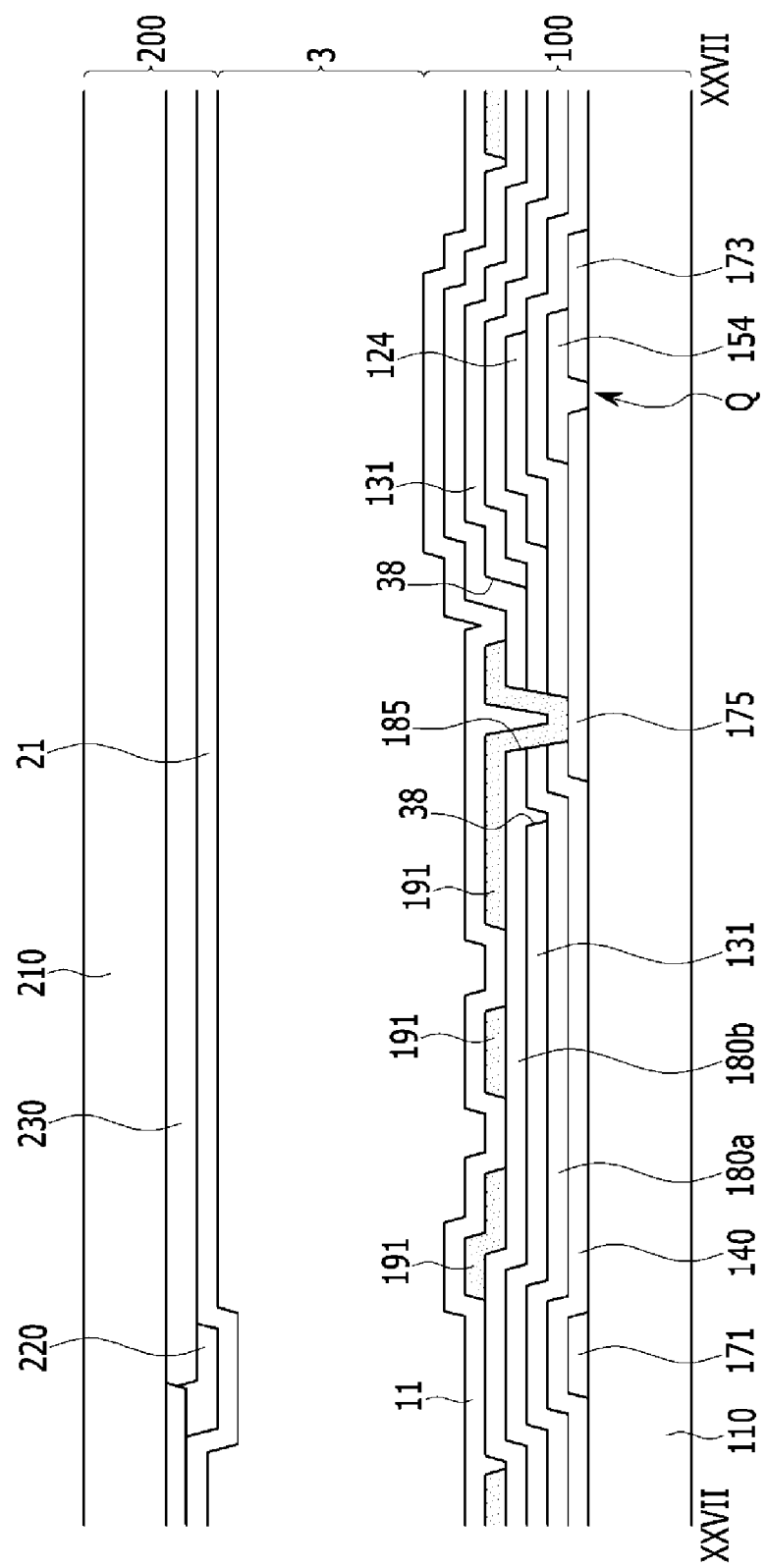
FIG. 27 is a cross-sectional view of the liquid crystal display of FIG. 26 taken along sectional line XXVII-XXVII, according to exemplary embodiments.
Figure 28:
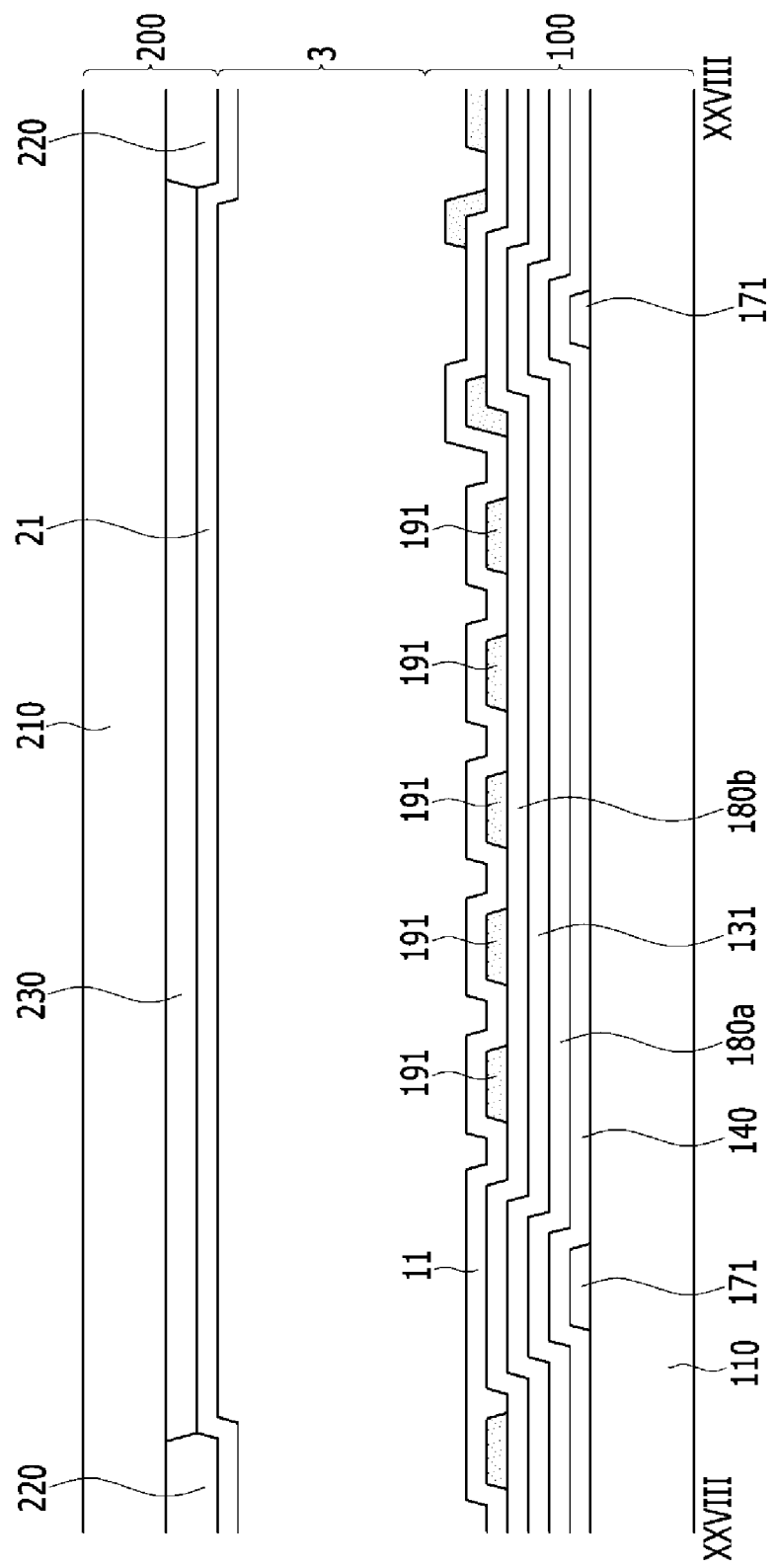
FIG. 28 is a cross-sectional view of the liquid crystal display of FIG. 26 taken along sectional line XXVIII-XXVIII, according to exemplary embodiments.

FIG. 26 is a layout view of a liquid crystal display, according to exemplary embodiments. FIG. 27 is a cross-sectional view of the liquid crystal display of FIG. 26 taken along sectional line XXVII-XXVII. FIG. 28 is a cross-sectional view of the liquid crystal display of FIG. 26 taken along sectional line XXVIII-XXVIII. It is noted that the liquid crystal display of FIGS. 26-28 is substantially the same as shown in FIGS. 9-25; however, the liquid crystal display of FIGS. 26-28 includes the gate line 121 longitudinally extending in a different direction.

According to exemplary embodiments, the lower panel 100 includes a plurality of data lines 171 and a plurality of drain electrodes 175 disposed on the insulation substrate 110. The data lines 171 longitudinally extend in substantially the y-direction. In exemplary embodiments, the longitudinal extension of the data lines 171 may be curved (or otherwise bent) in the x-direction; however, it is also contemplated that the data lines 171 may be straight or substantially straight. Each data line 171 includes a plurality of source electrodes 173. The drain electrode 175 includes a portion opposing the source electrode 173.

A plurality of semiconductors 154 may be disposed on the data lines 171 and the drain electrodes 175. Each semiconductor 154 overlaps with a corresponding portion of a source electrode 173 and a drain electrode 175. The semiconductor 154 may be formed of any suitable material, such as, for instance, amorphous silicon, crystalline silicon, an oxide, etc. As a metal oxide semiconductor, the oxide semiconductor may be formed of a metal oxide, such as, for instance, zinc (Zn), indium (In), gallium (Ga), tin (Sn), titanium (Ti), etc., or a combination thereof. Ohmic contacts (not shown) may be disposed between the source electrode 173 and drain electrode 175, and the semiconductor 154.

A gate insulating layer 140 is disposed on the semiconductor 154.

A plurality of gate lines 121 including a plurality of gate electrodes 124 is disposed on the gate insulating layer 140. The gate lines 121 longitudinally extend in substantially the x-direction. Each gate electrode 124 is disposed on the semiconductor 154. For instance, each gate electrode 124 may be disposed on a portion of the semiconductor 154 corresponding to a space between the source electrode 173 and the drain electrode 175.

The gate electrode 124, the source electrode 173, and the drain electrode 175 form the thin film transistor Q along with the semiconductor 154.

According to exemplary embodiments, the first passivation layer 180a is disposed on the thin film transistor Q, and a common electrode 131 is disposed on the first passivation layer 180a. The common electrode 131 may exhibit a planar shape, and, thereby, may be formed as a plate on the entire surface (or a portion thereof) of the insulation substrate 110. To this end, the first passivation layer 180a may include an opening 38 at a region corresponding to the drain electrode 175.

The second passivation layer 180b is disposed on the common electrode 131. A plurality of pixel electrodes 191, including branch electrodes 193 and a connection 195, are disposed on the second passivation layer 180b. The connection 195 connects upper and lower ends of a plurality of branch electrodes 193.

The gate insulating layer 140, the first passivation layer 180a, and the second passivation layer 180b may include a contact hole 185 exposing the drain electrode 175. In this manner, the pixel electrode 191 may be electrically connected to the drain electrode 175 via the contact hole 185, and, thereby, configured to receive the data voltage.

A first alignment layer 11 may be coated on an inner surface of the lower panel 100.

According to exemplary embodiments, the upper panel 200 may include a light blocking member 220 and a color filter 230 disposed on an insulation substrate 210. It is contemplated, however, that at least one of the light blocking member 220 and the color filter 230 may be disposed on the lower panel 100. A second alignment layer 21 may be coated on the color filter 230 and the light blocking member 220.

In exemplary embodiments, the first alignment layer 11 and the second alignment layer 21 may be horizontal alignment layers. It is contemplated, however, that any other suitable configuration may be utilized.

According to exemplary embodiments, the common electrode 131 of FIGS. 26-28 may include a plurality of openings (not shown) formed along the data line 171, such as previously described in association with FIGS. 7 and 8 and in FIGS. 23 and 24.

Figure 29:
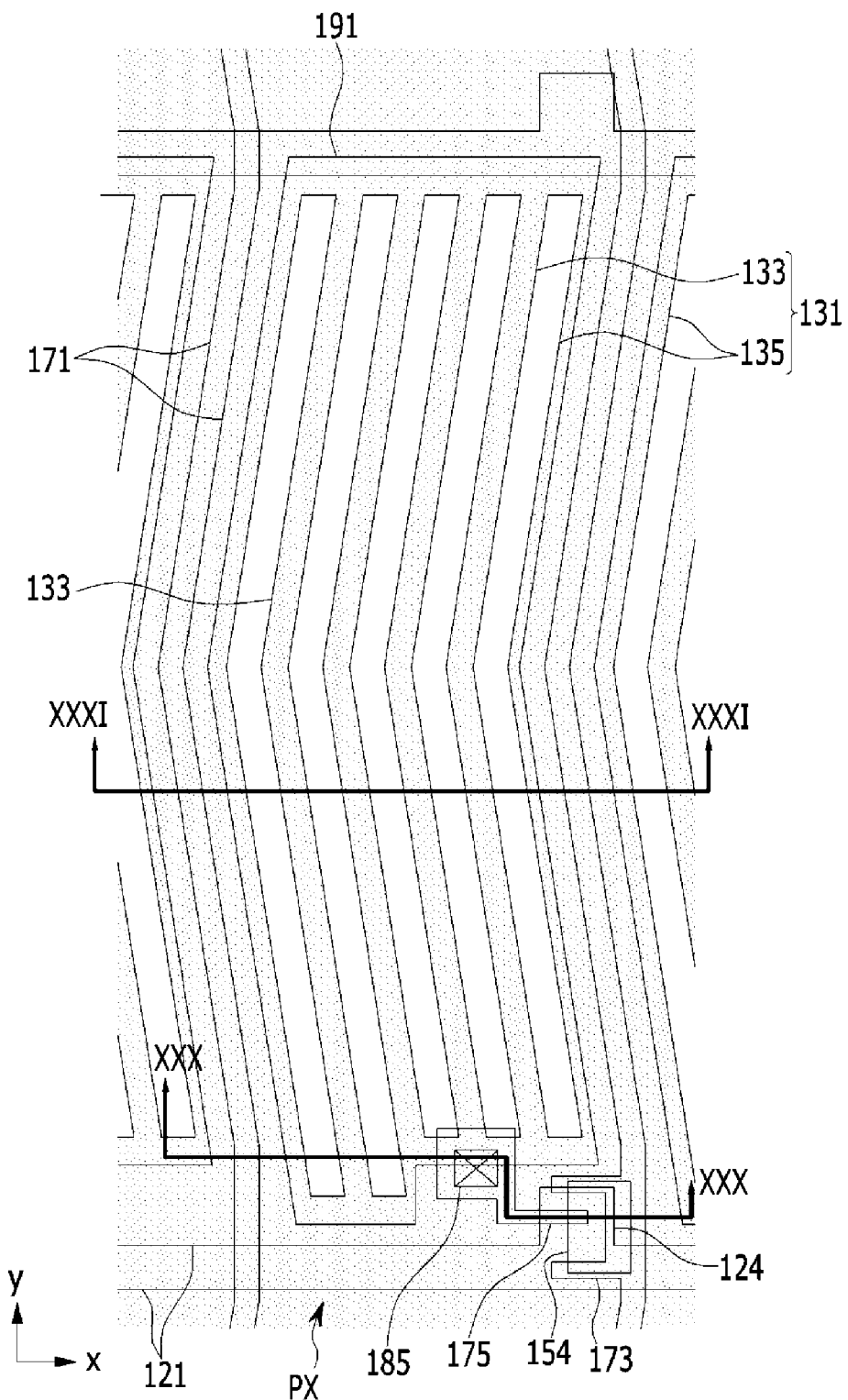
FIG. 29 is a layout view of a liquid crystal display, according to exemplary embodiments.
Figure 30:
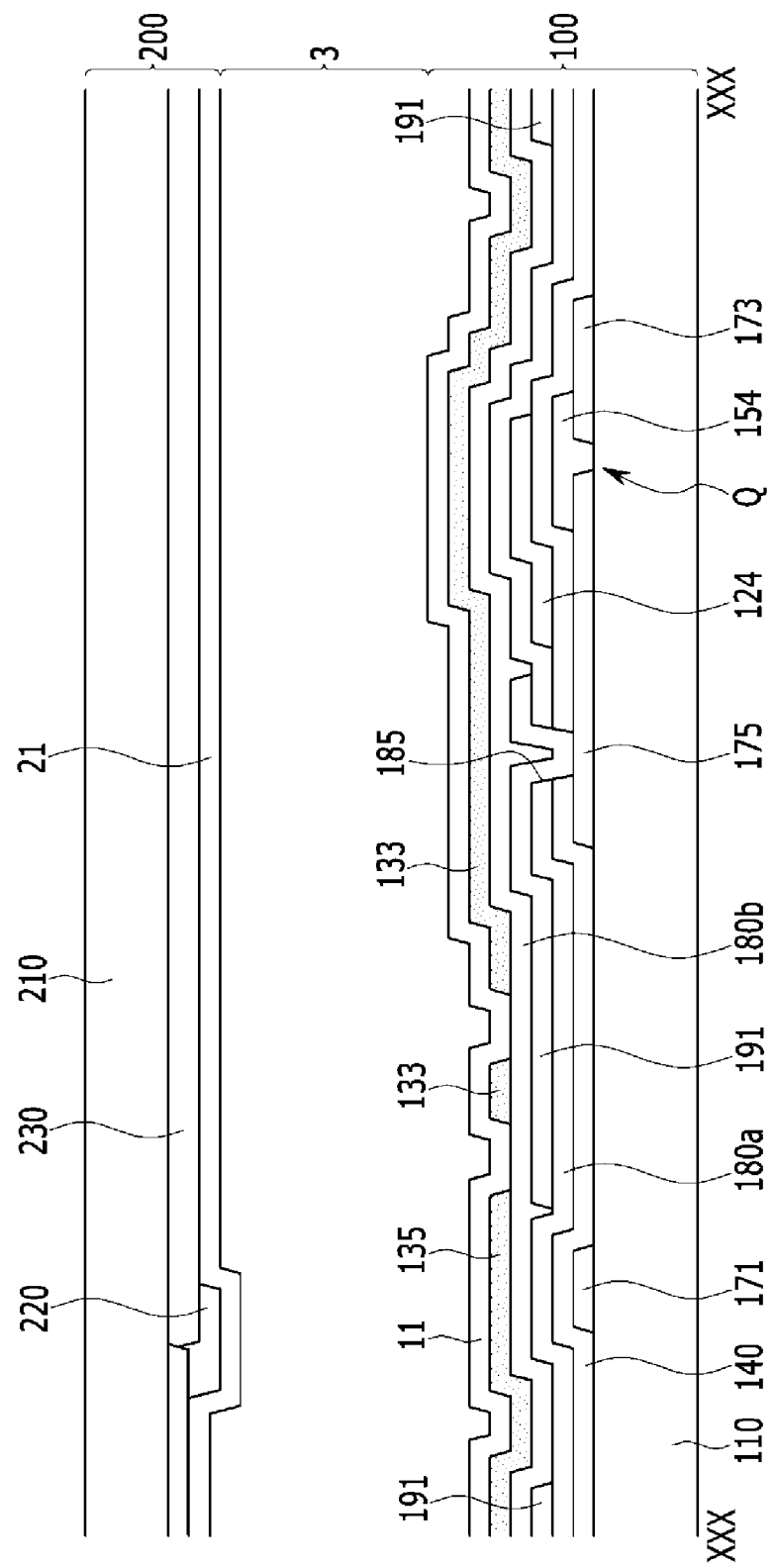
FIG. 30 is a cross-sectional view of the liquid crystal display of FIG. 29 taken along sectional line XXX-XXX, according to exemplary embodiments.
Figure 31:
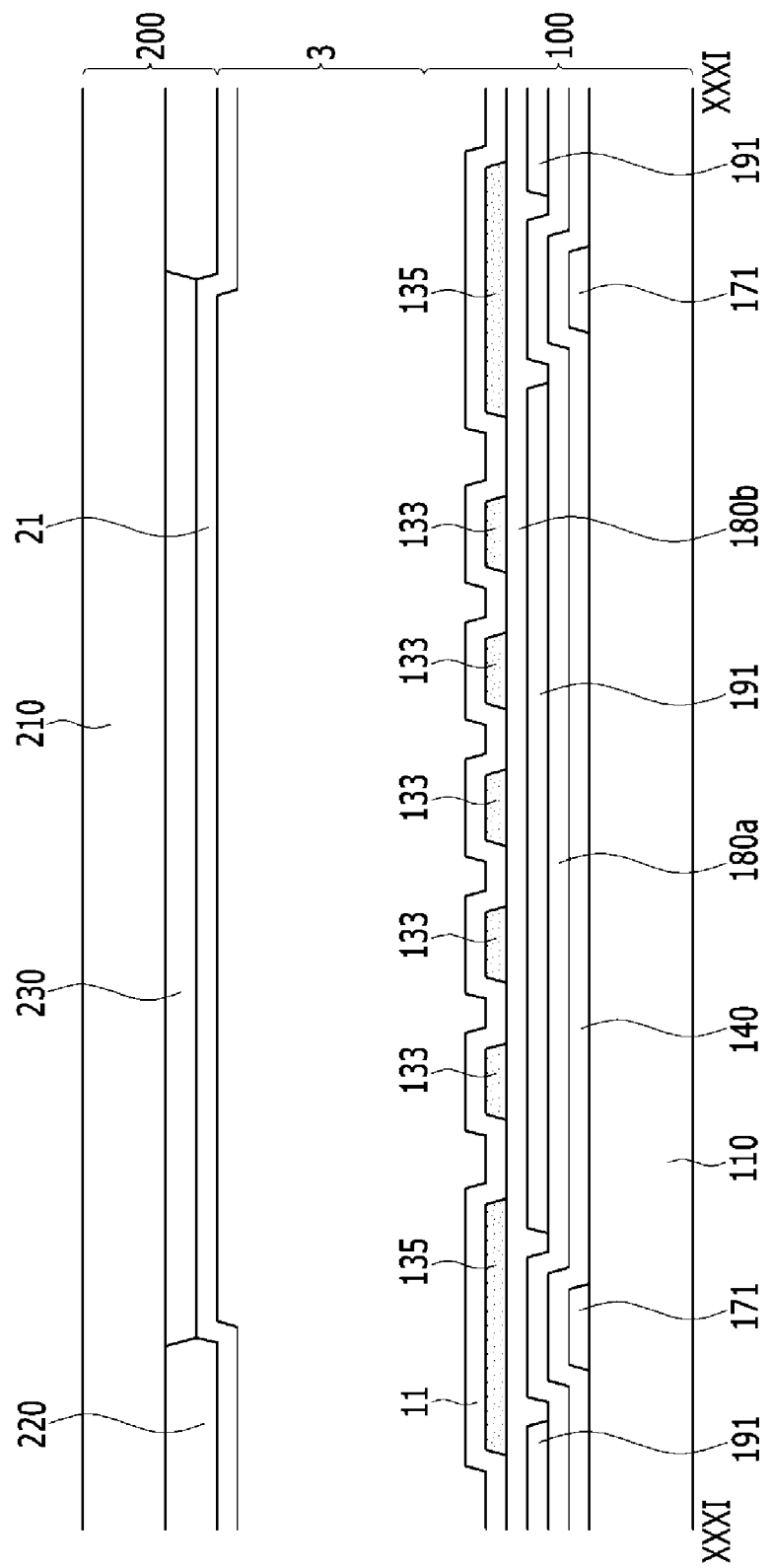
FIG. 31 is a cross-sectional view of the liquid crystal display of FIG. 29 taken along sectional line XXXI-XXXI, according to exemplary embodiments.

FIG. 29 is a layout view of a liquid crystal display, according to exemplary embodiments. FIG. 30 is a cross-sectional view of the liquid crystal display of FIG. 29 taken along sectional line XXX-XXX. FIG. 31 is a cross-sectional view of the liquid crystal display of FIG. 29 taken along sectional line XXXI-XXXI. The liquid crystal display of FIGS. 29-31 is substantially the same as shown in FIGS. 26-28, however, the liquid crystal display of FIGS. 29-31 may include differently disposed pixel electrodes 191 and common electrode 131.

For instance, differently than as shown in FIGS. 26-28, the first passivation layer 180a, in FIGS. 29-31, is disposed on the thin film transistor Q. A plurality of pixel electrodes 191 is disposed on the first passivation layer 180a. The second passivation layer 180b and the common electrode 131 may be sequentially disposed on the pixel electrode 191.

According to exemplary embodiments, the pixel electrode 191 may have a planar shape, which may fill most of the region enclosed by the gate line 121 and the data line 171. The shape of the pixel electrode 191 may polygonal with edges substantially extending parallel to the gate lines 121 and the data line 171. The pixel electrode 191 may be electrically connected to the drain electrode 175 via the contact hole 185, which is formed in the gate insulating layer 140 and the first passivation layer 180a. As such, the pixel electrode 191 may be configured to receive the data voltage.

The common electrode 131 includes a plurality of branch electrodes 133 overlapping with each pixel electrode 191 and a boundary portion 135 overlapping with the data line 171. The boundary portion 135 may be disposed close to a boundary of adjacently disposed pixels PX neighboring each other in the x-direction. The boundary portion 135 covers the data line 171 and may longitudinally extend substantially parallel to the data line 171.

According to exemplary embodiments, the boundary portion 135 of the common electrode 131 may include a plurality of openings (not shown) formed along the data line 171, such as previously described in association with FIGS. 3 and 4 or FIGS. 19 and 20.

Accordingly, it is noted that the liquid crystal displays shown in FIGS. 26-28 or FIGS. 29-31 may include the data line 171 being disposed between the pixel array and the branch electrode 193 of the pixel electrode 191. The data line 171 may longitudinally extend in substantially the y-direction. Further, the common electrode 131 may overlap with the data line 171. It is also noted that the data line 171 may be disposed as the layer closest to the insulation substrate 110 among the layers where the several terminals of the thin film transistor Q connected to the pixel electrode 191 are positioned. That is, the data line 171 may be disposed under the gate insulating layer 140, such as, for instance, directly disposed on the insulation substrate 110. As such, the distance between the data line 171 and the common electrode 131 or the pixel electrode 191 may be maximized (or otherwise increased). Further, the parasitic capacitance between the data line 171 and the common electrode 131 or the pixel electrode 191 may be reduced, which, thereby, minimizes (or otherwise reduces) the signal delay of the data line 171. Also, crosstalk between the data line 171 and the common electrode 131 or the pixel electrode 191 may be reduced, which, thereby, reduces light leakage resulting from, for instance, electric field distortion(s).

According to exemplary embodiments, it is not necessary to form an insulating layer made of an organic insulating material between the data line 171 and the common electrode 131 or the pixel electrode 191. Accordingly, as compared to instances when an insulating layer made of an organic insulating material is disposed between the data line 171 and the common electrode 131 or the pixel electrode 191, the material cost, in exemplary embodiments, may be reduced and the processing steps, such as the deposition and the photo-processing steps, and time may be reduced. Further, absorption of incident light by an organic insulating material may be avoided (or otherwise reduced) such that the transmittance of the corresponding liquid crystal display may be increased. Moreover, it is not necessary to form a contact hole in a thick organic insulating material, such that an aperture ratio of the liquid crystal display is not undesirably reduced.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A liquid crystal display comprising:
    a substrate;
    data lines disposed on the substrate and extending substantially in a first direction;
    a first insulating layer disposed on the data lines;
    a first electrode disposed on the first insulating layer;
    a thin film transistor connected to a first data line of the data lines, the thin film transistor comprising the first electrode;
    a pixel electrode connected to the thin film transistor, a first length of the pixel electrode in the first direction is greater than a second length of the pixel electrode in a second direction perpendicular to the first direction;
    a common electrode overlapping at least a portion of the pixel electrode; and
    a second insulating layer disposed between the pixel electrode and the common electrode,
    wherein:
        one of the pixel electrode and the common electrode has a planar shape and the other comprises branch electrodes overlapping at least a portion of the planar-shaped electrode;
        the branch electrodes extend substantially parallel to the first data line;
        the common electrode at least partially overlaps the first data line; and
        the first data line is configured to transmit a data signal to the thin film transistor.

2. The liquid crystal display of claim 1, further comprising:
    a gate line disposed on the first insulating layer, the gate line being connected to the first electrode and extending in a direction crossing the first direction,
    wherein the thin film transistor further comprises:
        a source electrode connected to the first data line;
        a drain electrode facing the source electrode; and
        a semiconductor disposed on respective portions of the source electrode and the drain electrode.

3. The liquid crystal display of claim 2, further comprising:
    a third insulating layer disposed between the first data line and the common electrode,
    wherein the third insulating layer does not comprise an organic insulating material.

4. The liquid crystal display of claim 2, wherein:
    the semiconductor comprises an oxide semiconductor.

5. The liquid crystal display of claim 1, further comprising:
    a third insulating layer disposed between the first insulating layer and the second insulating layer,
    wherein each of the first insulating layer, the second insulating layer, and the third insulating layer are disposed between the first data line and the one of the pixel electrode and the common electrode comprising the branch electrodes.

6. The liquid crystal display of claim 1, further comprising:
    a third insulating layer disposed between the first insulating layer and the second insulating layer,
    wherein each of the first insulating layer, the second insulating layer, and the third insulating layer are disposed between the first data line and the planar-shaped electrode.

* * * * *